(12) United States Patent
Yeh et al.

(10) Patent No.: US 12,471,333 B2
(45) Date of Patent: Nov. 11, 2025

(54) ELECTRONIC DEVICE

(71) Applicant: Innolux Corporation, Miao-Li County (TW)

(72) Inventors: Chen-Lin Yeh, Miao-Li County (TW); Chin-Lung Ting, Miao-Li County (TW); Chung-Kuang Wei, Miao-Li County (TW); Jen-Hai Chi, Miao-Li County (TW); Yi-Hung Lin, Miao-Li County (TW); Yan-Zheng Wu, Miao-Li County (TW)

(73) Assignee: Innolux Corporation, Miao-Li County (TW)

( * ) Notice: Subject to any disclaimer, the term of this patent is extended or adjusted under 35 U.S.C. 154(b) by 667 days.

(21) Appl. No.: 17/561,716

(22) Filed: Dec. 24, 2021

(65) Prior Publication Data

US 2022/0216302 A1 Jul. 7, 2022

Related U.S. Application Data

(60) Provisional application No. 63/134,186, filed on Jan. 6, 2021.

(30) Foreign Application Priority Data

Nov. 1, 2021 (CN) .......................... 202111284065.X

(51) Int. Cl.
*H10D 62/13* (2025.01)
*H05K 1/11* (2006.01)
*H05K 3/34* (2006.01)

(52) U.S. Cl.
CPC ............. *H10D 62/13* (2025.01); *H05K 1/111* (2013.01); *H05K 3/3457* (2013.01)

(58) Field of Classification Search
CPC .............. H01Q 1/2283; H01Q 15/002; H01Q 15/0066; H01L 29/08; H01L 29/93; H05K 1/0243; H10D 1/64
See application file for complete search history.

(56) References Cited

U.S. PATENT DOCUMENTS

2003/0003862 A1 1/2003 Yoshida et al.
2005/0099347 A1* 5/2005 Yamaki .................. H01Q 9/285
343/702

(Continued)

FOREIGN PATENT DOCUMENTS

CN 111952193 11/2020

OTHER PUBLICATIONS

"Search Report of Europe Counterpart Application", issued on May 19, 2022, p. 1-p. 9.

*Primary Examiner* — Erik Kielin
(74) *Attorney, Agent, or Firm* — JCIPRNET

(57) ABSTRACT

Disclosed is an electronic device, including a substrate, a first electrode, a second electrode, a modulation element, a first solder, and a switch element. The first electrode is disposed on the substrate. The second electrode is disposed on the substrate. The modulation element is disposed on the substrate and includes at least two connecting pads. The first solder is disposed between the first electrode and one connecting pad of the modulation element. The switch element is disposed on the substrate. The one connecting pad of the modulation element is electrically connected to the switch element sequentially through the first solder, the first electrode, and the second electrode.

7 Claims, 25 Drawing Sheets

(56) References Cited

U.S. PATENT DOCUMENTS

| | | |
|---|---|---|
| 2009/0015497 A1* | 1/2009 | Nagumo ............... H01Q 5/392 |
| | | 343/750 |
| 2009/0153421 A1 | 6/2009 | Rofougaran et al. |
| 2011/0309493 A1* | 12/2011 | Goh ..................... H01L 21/568 |
| | | 257/737 |
| 2016/0013531 A1* | 1/2016 | Casse ..................... H01Q 3/36 |
| | | 333/161 |
| 2019/0238375 A1 | 8/2019 | Bowen et al. |
| 2019/0295972 A1 | 9/2019 | Tsai et al. |
| 2020/0044326 A1 | 2/2020 | Olfert et al. |
| 2021/0050671 A1 | 2/2021 | Stevenson et al. |

* cited by examiner

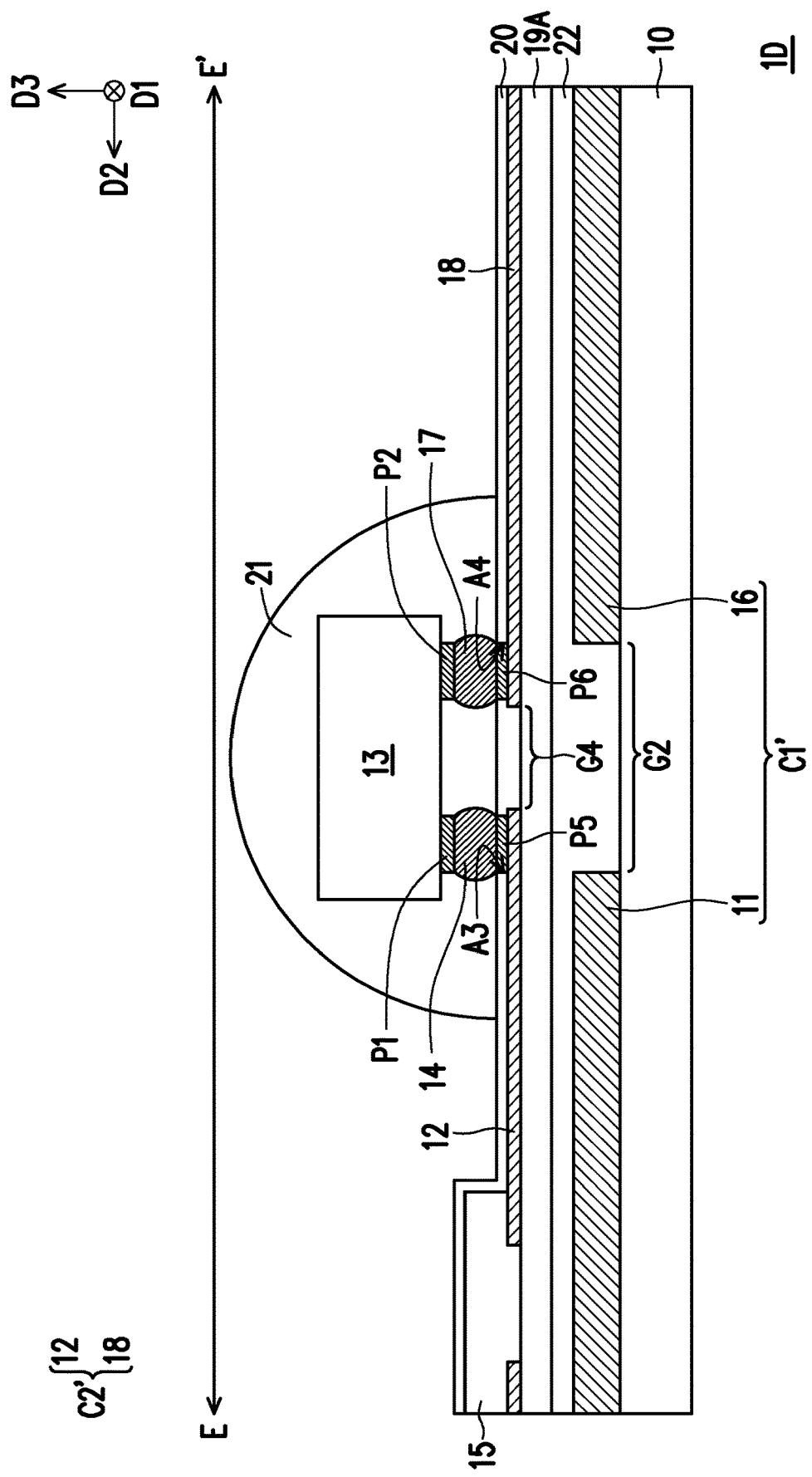

ELECTRONIC DEVICE

CROSS-REFERENCE TO RELATED APPLICATION

This application claims the priority benefit of U.S. provisional application Ser. No. 63/134,186, filed on Jan. 6, 2021 and Chinese application no. 202111284065.X, filed on Nov. 1, 2021. The entirety of each of the above-mentioned patent applications is hereby incorporated by reference herein and made a part of this specification.

BACKGROUND

Technical Field

The disclosure relates to an electronic device.

Description of Related Art

Among electronic devices, a radio frequency (RF) device is employed to transmit or receive electromagnetic waves, and is thus an indispensable part of wireless communication technology. How to improve directivity of the radio frequency device so that the electromagnetic wave propagates in a specific direction is one of research and development focuses for researchers in the related field.

SUMMARY

The disclosure provides an electronic device, in which improvement to directivity of a radio frequency device can be facilitated.

According to an embodiment of the disclosure, an electronic device includes a substrate, a first electrode, a second electrode, a modulation element, a first solder, and a switch element. The first electrode is disposed on the substrate. The second electrode is disposed on the substrate. The modulation element is disposed on the substrate and includes at least two connecting pads. The first solder is disposed between the first electrode and one connecting pad of the modulation element. The switch element is disposed on the substrate. The one connecting pad of the modulation element is electrically connected to the switch element sequentially through the first solder, the first electrode, and the second electrode.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

FIG. 5A and FIG. 5B are respectively a schematic partial cross-sectional view and a schematic partial top view of an electronic device according to a fifth embodiment of the disclosure.

DESCRIPTION OF THE EMBODIMENTS

Figure 1A:
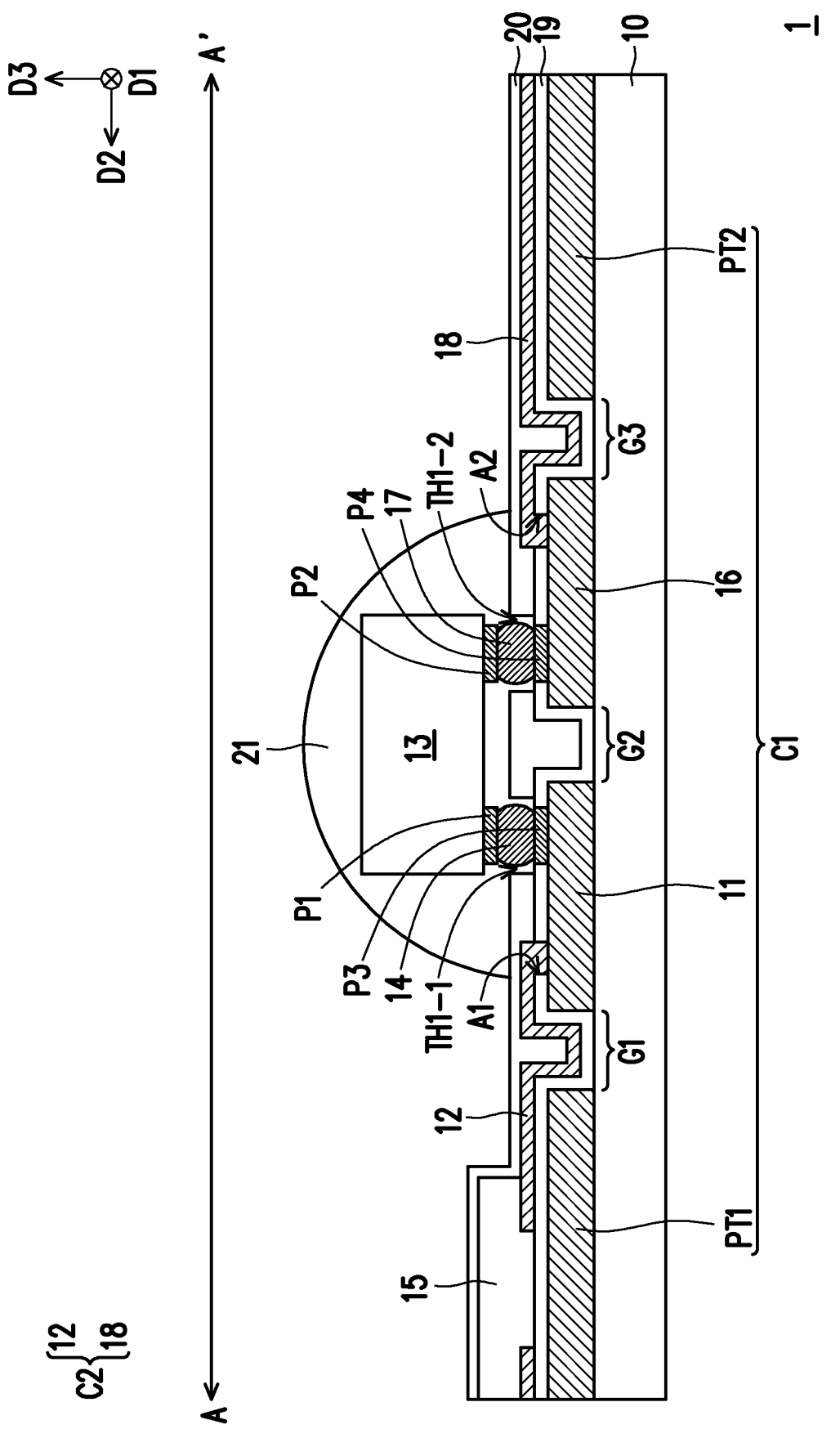
FIG. 1A and FIG. 1B are respectively a schematic partial cross-sectional view and a schematic partial top view of an electronic device according to a first embodiment of the disclosure.

The disclosure may be understood with reference to the following detailed description and the accompanying drawings. It should be noted that, for ease of understanding by readers and simplicity of the drawings, the multiple drawings in the disclosure show only a part of an electronic device/display device, and specific elements in the drawings are not drawn to actual scale. In addition, the number and size of each element in the figures only serve for exemplifying instead of limiting the scope of the disclosure. For example, the relative size, thickness, and position of each film layer, region, or structure may be reduced or increased for clarity.

Some terms are used to refer to specific elements throughout the whole specification and the appended claims in the disclosure. Those skilled in the art should understand that electronic device manufacturers may use different names to refer to the same elements. Herein, it is not intended to distinguish elements with the same function but different names. In the description and claims below, terms such as "have" and "include" are open-ended terms, so they should be interpreted as "including, but not limited to . . . ".

The directional terms mentioned herein, such as "above", "below", "front", "back", "left", "right", and the like, refer only to the directions in the accompanying drawings. Therefore, the directional terms are used for describing instead of limiting the disclosure. It should be understood that when an element or film layer is referred to as being disposed "on", or "connected to" another element or film layer, the element or film layer may be directly on or connected to said another element or film layer, or intervening elements or film layers may also be present (non-direct circumstances). In contrast, when an element or film layer is referred to as being "directly on" or "directly connected to" another element, no intervening elements or film layers are present.

The terms "about", "equal to", "equal", "same", "substantially", or "generally" mentioned herein typically mean within a range of 10% of a given value, or within a range of 5%, 3%, 2%, 1%, or 0.5% of the given value. In addition, unless otherwise specified, the terms "the given range is from a first value to a second value" and "the given value falls within a range of a first value to a second value" each mean that the given range includes the first value, the second value, and other values in between.

In the embodiment of the disclosure, terms such as "connect", "interconnect", and the like, regarding bonding and connection, unless specifically defined, may mean that two structures are in direct contact, or may also mean that two structures are not in direct contact, and other structures are disposed between the two structures. The terms regarding bonding and connection may also include the case where both structures are movable or both structures are fixed. In addition, the term "electrical connection" refers to series connection between two elements through direct or indirect connection. For example, the two elements may be directly connected, or the two elements may be connected in series through one or more conductive elements. Moreover, the term "electrically coupling" refers to two elements separated from each other without any other conductive element between the two elements to connect the two in series.

In the following embodiments, the same or similar elements will use the same or similar reference numerals, and repeated description thereof will be omitted. In addition, features in different embodiments may be arbitrarily mixed and used in combination with each other without departing from or conflicting with the spirit of the disclosure, and simple equivalent variations and modifications made in accordance with this specification or the claims are still within the scope covered by the disclosure. Moreover, "first", "second", and similar terms mentioned in the specification or the claims serve to merely name discrete elements or differentiate among different embodiments or scopes, and are not intended to limit an upper limit or a lower limit of the quantity of elements or limit the manufacturing sequence or configuration sequence of elements.

The electronic device of the disclosure may include, but is not limited to, a radio frequency device or an electronic device having a radio frequency element. The electronic device may include a bendable or flexible electronic device. The radio frequency element may include a frequency selective surface (FSS), RF-Filter, polarizer, resonator, antenna, or the like. The radio frequency device will be taken as the electronic device below to describe the content of the disclosure. Nonetheless, the disclosure is not limited thereto.

Figure 1B:
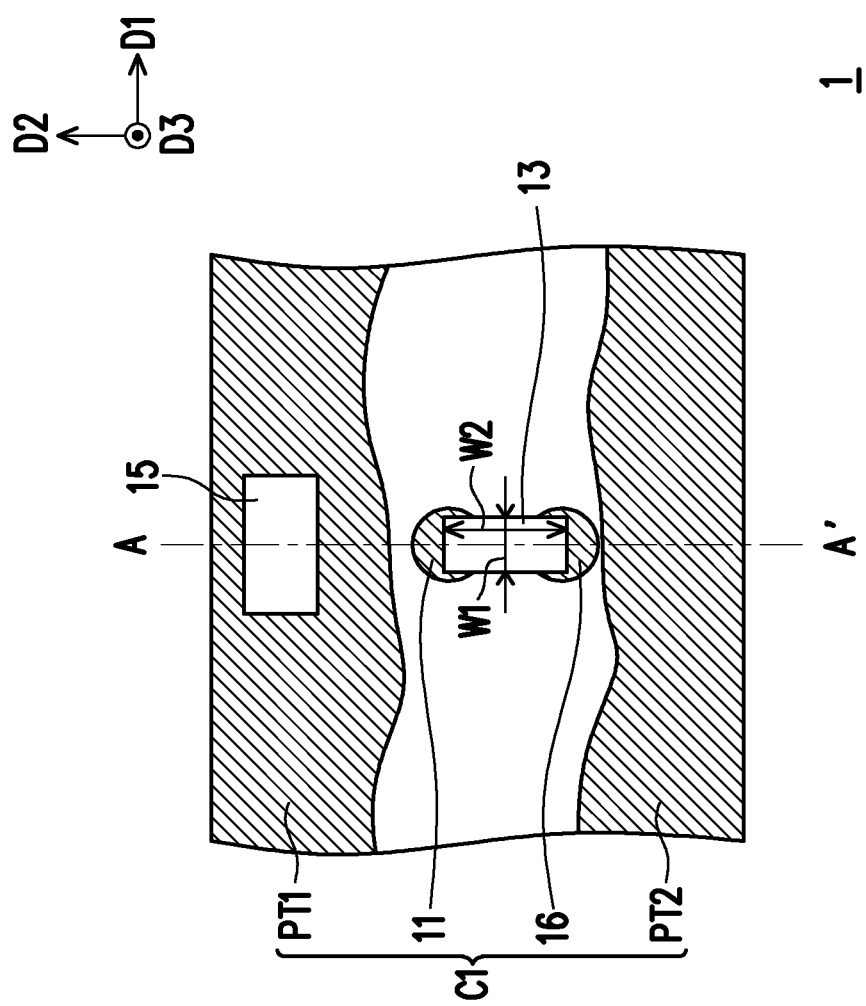

FIG. 1A and FIG. 1B are respectively a schematic partial cross-sectional view and a schematic partial top view of an electronic device according to a first embodiment of the disclosure. In order to clearly show the relative configuration relationships between some elements and/or film layers, FIG. 1B omits illustration of some elements and/or film layers of the electronic device. In addition, reference may be made to FIG. 1A for the cross-section of section line A-A' in FIG. 1B.

With reference to FIG. 1A and FIG. 1B, an electronic device 1 may include a substrate 10, a first electrode 11, a second electrode 12, a modulation element 13, a first solder 14, and a switch element 15. The first electrode 11 is disposed on the substrate 10. The second electrode 12 is disposed on the substrate 10. The modulation element 13 is disposed on the substrate 10 and includes at least two connecting pads, for example, a connecting pad P1 and a connecting pad P2. The first solder 14 is disposed between the first electrode 11 and one connecting pad (e.g., the connecting pad P1) of the modulation element 13. The switch element 15 is disposed on the substrate 10. The one connecting pad (e.g., the connecting pad P1) of the modulation element 13 is electrically connected to the switch element 15 sequentially through the first solder 14, the first electrode 11, and the second electrode 12.

To be specific, the substrate 10 is configured to carry elements. The substrate 10 may be a rigid substrate, a bendable substrate, or a flexible substrate. For example, the substrate 10 may include, but is not limited to, a glass substrate, a polymer film, a printed circuit board, a base layer formed of ceramics, or a combination of the above.

From the cross-sectional view of the electronic device 1, as shown in FIG. 1A, the first electrode 11 is disposed between the substrate 10 and the second electrode 12, and the second electrode 12 is disposed between the first electrode 11 and the switch element 15. The first electrode 11 and the second electrode 12 serve as an intermediate medium for electrically connecting the switch element 15 and the modulation element 13. For example, the materials of the first electrode 11 and the second electrode 12 may include, but is not limited to, copper, aluminum, any material with high conductivity, or a combination of the above.

The modulation element 13 is disposed corresponding to the first electrode 11. For example, the modulation element 13 at least partially overlaps the first electrode 11 in the normal direction (e.g., a third direction D3) of the substrate 10. From the top view of the electronic device 1, as shown in FIG. 1B, the modulation element 13 respectively has a width W1 and a width W2 in a first direction D1 and a second direction D2. The width W1 and the width W2 may be greater than or equal to 20 micrometers and less than or equal to 1000 micrometers (20 μm≤W1≤1000 μm; 20 μm≤W2≤1000 μm). Nonetheless, the disclosure is not limited thereto.

In some embodiments, the modulation element 13 includes a variable capacitor. For example, the variable capacitor may be formed by a liquid crystal device, a variable capacitor diode, micro electro mechanical systems (MEMS), or the like. Nonetheless, the disclosure is not limited thereto.

By changing the voltage applied to the variable capacitor, the equivalent capacitance in the radio frequency circuit can be controlled, so that the phase and the amplitude of the electromagnetic wave change correspondingly, thus controlling the direction of the electromagnetic wave or improving directivity of the radio frequency device. The transmission medium of the electromagnetic wave may include, but is not limited to, a transmission line, a waveguide structure, a free space, or the like. The electromagnetic wave may include, but is not limited to, a planar wave, a cylindrical wave, a spherical wave, or the like. The frequency range of the electromagnetic wave may include, but is not limited to, radio frequency, millimeter wave, Terahertz (THz), infrared light, visible light, or the like.

The connecting pad P1 of the modulation element 13 is welded on the first electrode 11 through the first solder 14. For example, the first solder 14 may include, but is not limited to, a solder ball, a copper pillar, any other suitable metal, or a metal alloy.

The switch element 15 is configured to drive the modulation element 13. For example, the switch element 15 may include a thin film transistor (TFT). The material of the channel layer (not shown) of the thin film transistor may include, but is not limited to, low-temperature polysilicon, amorphous silicon, oxide semiconductor, organic semiconductor, III-V compound semiconductor, or the like.

Depending on different requirements, the electronic device 1 may also include other elements or layers. For example, the electronic device 1 may also include a third electrode 16 and a second solder 17. Nonetheless, the disclosure is not limited thereto.

The third electrode 16 is disposed on the substrate 10. In some embodiments, the third electrode 16 and the first electrode 11 may be manufactured in the same layer. For example, the third electrode 16 and the first electrode 11 may both belong to a first conductive layer C1. In other words, the third electrode 16 and the first electrode 11 may have the same material and may be formed by the same patterning process.

The second solder 17 is disposed between the third electrode 16 and the other connecting pad (e.g., the connecting pad P2) of the modulation element 13. The other connecting pad (e.g., the connecting pad P2) of the modulation element 13 may be electrically connected to the third electrode 16 through the second solder 17. Specifically, the connecting pad P2 of the modulation element 13 is welded on the third electrode 16 through the second solder 17. The second solder 17 may include, for example but not limited to, a tin ball, a copper pillar, any other suitable metals, or a metal alloy.

In some embodiments, the electronic device 1 may also include a fourth electrode 18. The fourth electrode 18 is arranged on the substrate 10. In addition, from the cross-sectional view of the electronic device 1, as shown in FIG. 1A, the third electrode 16 is disposed between the fourth electrode 18 and the substrate 10. In some embodiments, the fourth electrode 18 and the second electrode 12 may be manufactured in the same layer. For example, the fourth electrode 18 and the second electrode 12 may both belong to a second conductive layer C2. In other words, the fourth electrode 18 and the second electrode 12 may have the same material and may be formed by the same patterning process.

In some embodiments, the first conductive layer C1 may also include a conductive pattern PT1 and a conductive pattern PT2 in addition to the first electrode 11 and the third electrode 16. The first electrode 11 is disposed between the conductive pattern PT1 and the third electrode 16. In addition, the first electrode 11, the conductive pattern PT1, and the third electrode 16 are separated from each other. For example, a gap G1 is present between the first electrode 11 and the conductive pattern PT1, and a gap G2 is present between the first electrode 11 and the third electrode 16. The third electrode 16 is disposed between the first electrode 11 and the conductive pattern PT2. In addition, the third electrode 16, the first electrode 11, and the conductive pattern PT2 are separated from each other. For example, a gap G3 is present between the third electrode 16 and the conductive pattern PT2.

From the cross-sectional view of the electronic device 1, as shown in FIG. 1A, the conductive pattern PT1 is disposed between the second electrode 12 and the substrate 10, and the second electrode 12 is disposed between the switch element 15 and the conductive pattern PT1. The gap G1 between the conductive pattern PT1 and the first electrode 11 may be covered by the second electrode 12. In addition, the conductive pattern PT2 is disposed between the fourth electrode 18 and the substrate 10. The gap G3 between the conductive pattern PT2 and the third electrode 16 may be covered by the fourth electrode 18. Moreover, the modulation element 13 is disposed corresponding to the gap G2 between the first electrode 11 and the third electrode 16. For example, the modulation element 13 at least partially overlaps the gap G2 in the third direction D3.

In some embodiments, the first conductive layer C1 and the second conductive layer C2 may each be a metal layer. The electromagnetic wave transmitted below the first conductive layer C1 may be transmitted to the modulation element 13 from the region (e.g., the gap G2) that is not covered by the first conductive layer C1 or the second conductive layer C2, and output from the electronic device 1 after operation (e.g., adjustment of the phase, amplitude, transmission direction, or the like of the electromagnetic wave) of the modulation element 13.

In some embodiments, the electronic device 1 may also include an isolation layer 19. In addition, the first conductive layer C1 and the second conductive layer C2 may be separated from each other by the isolation layer 19. For example, the conductive pattern PT1 may be separated from the second electrode 12 and the switch element 15 by the isolation layer 19, and the conductive pattern PT2 may be separated from the fourth electrode 18 by the isolation layer 19. The isolation layer 19 may have an opening A1 and an opening A2. The opening A1 and the opening A2 respectively expose the first electrode 11 and the third electrode 16. The second electrode 12 is electrically connected to the first electrode 11 through the opening A1. The fourth electrode 18 is electrically connected to the third electrode 16 through the opening A2. The material of the isolation layer 19 may include, but is not limited to, silicon nitride (SiNx), silicon oxide (SiOx), epoxy resin, acrylic, solder resist, silicon materials, bismaleimide, polyimide, or a combination of the above.

In some embodiments, the electronic device 1 may also include a passivation layer 20. The passivation layer 20 covers the switch element 15, the second electrode 12, and the isolation layer 19. The material of the passivation layer 20 may include, but is not limited to, silicon nitride, silicon oxide, epoxy resin, acrylic, solder resist, silicon materials, bismaleimide, polyimide, or a combination of the above.

The electronic device 1 may have a through hole TH1-1 and a through hole TH1-2. The through hole TH1-1 may be located between the opening A1 and the through hole TH1-2, and the through hole TH1-1 penetrates the passivation layer 20 and the isolation layer 19 and exposes the first electrode 11. The through hole TH1-2 may be located between the through hole TH1-1 and the opening A2, and the through hole TH1-2 penetrates the passivation layer 20 and the isolation layer 19 and exposes the third electrode 16.

The electronic device 1 may also include a connecting pad P3 and a connecting pad P4. The connecting pad P3 is disposed in the through hole TH1-1 and on the first electrode 11. The first solder 14 is also disposed in the through hole TH1-1 and may be electrically connected between the connecting pad P1 and the connecting pad P3. The connecting pad P4 is disposed in the through hole TH1-2 and on the third electrode 16. The second solder 17 is also disposed in the through hole TH1-2 and may be electrically connected between the connecting pad P2 and the connecting pad P4. The connecting pad P1 of the modulation element 13 may be electrically connected to the switch element 15 sequentially through the first solder 14, the connecting pad P3, the first electrode 11, and the second electrode 12, for example. The connecting pad P2 of the modulation element 13 may be electrically connected to ground sequentially through the second solder 17, the connecting pad P4, the third electrode 16, and the fourth electrode 18, for example. The voltage (e.g., a DC voltage) received by the connecting pad P1 is different from a voltage (e.g., a ground voltage) received by the connecting pad P2. The materials of the connecting pad P3 and the connecting pad P4 may include, but is not limited to, nickel gold, nickel palladium gold, silver, gold, nickel, tin, organic solderability preservative (OSP), other conductive materials, or a combination of the above. In some embodiments, the size of the connecting pad P3 and the connecting pad P4 may be 10 micrometers*10 micrometers to 160 micrometers*160 micrometers (10 μm*10 μm≤size≤160 μm*160 μm). Nonetheless, the disclosure is not limited thereto.

In some embodiments, the electronic device 1 may also include a protection layer 21. The protection layer 21 is disposed on the passivation layer 20, and the protection layer 21 may cover the modulation element 13 and wrap the connecting pad P1, the connecting pad P2, the first solder 14, and the second solder 17. Nonetheless, the disclosure is not limited thereto. The cross-sectional shape of the protection layer 21 may include a hemispherical shape, but is not limited thereto. It should be noted that the hemisphere is not limited to half of a sphere. The material of the protection layer 21 may include, but is not limited to, epoxy resin, acrylic, solder resist, silicon materials, bismaleimide, polyimide, parylene, or a combination of the above.

Figure 2A:
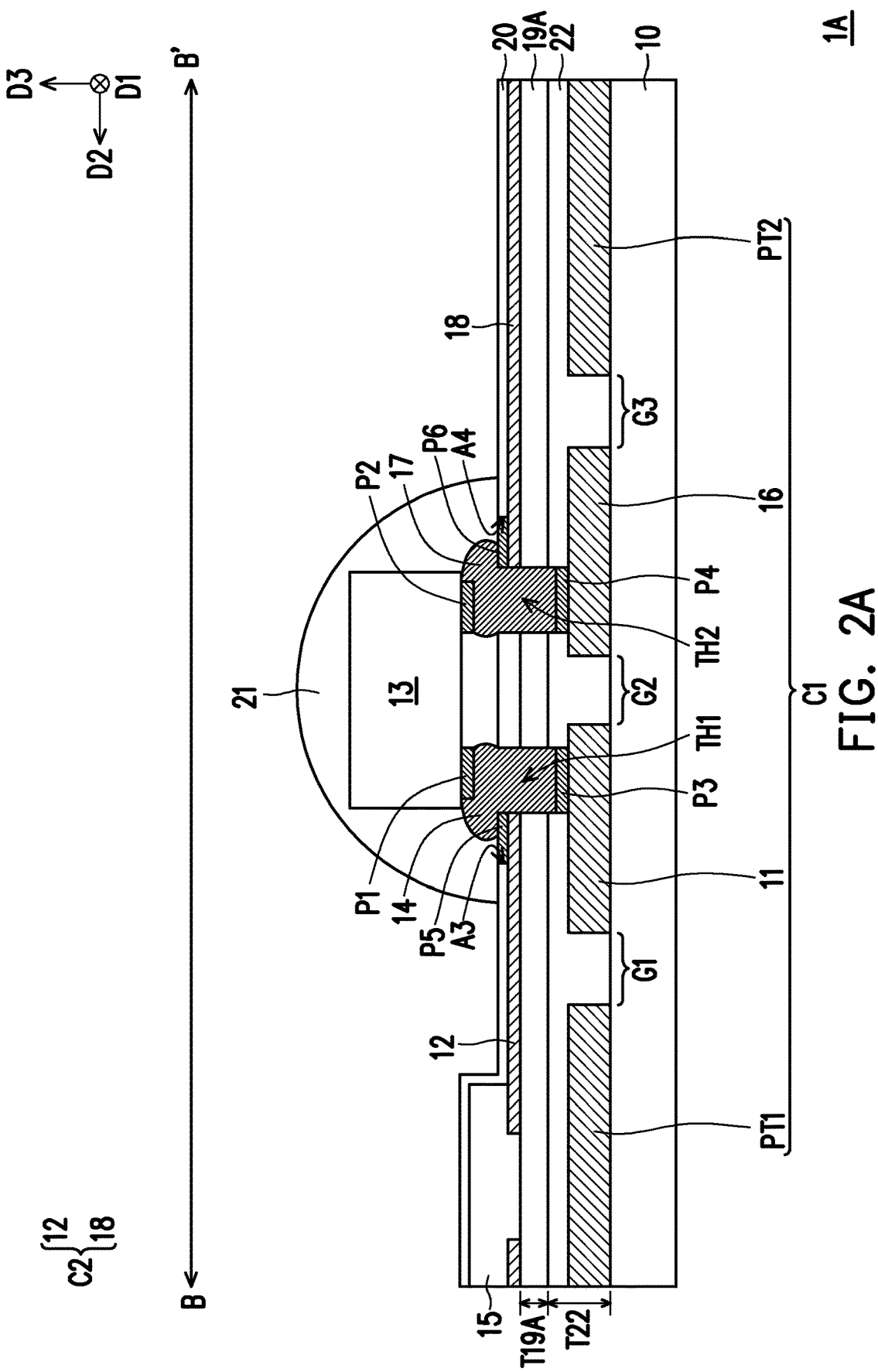
FIG. 2A and FIG. 2B are respectively a schematic partial cross-sectional view and a schematic partial top view of an electronic device according to a second embodiment of the disclosure.
Figure 2B:
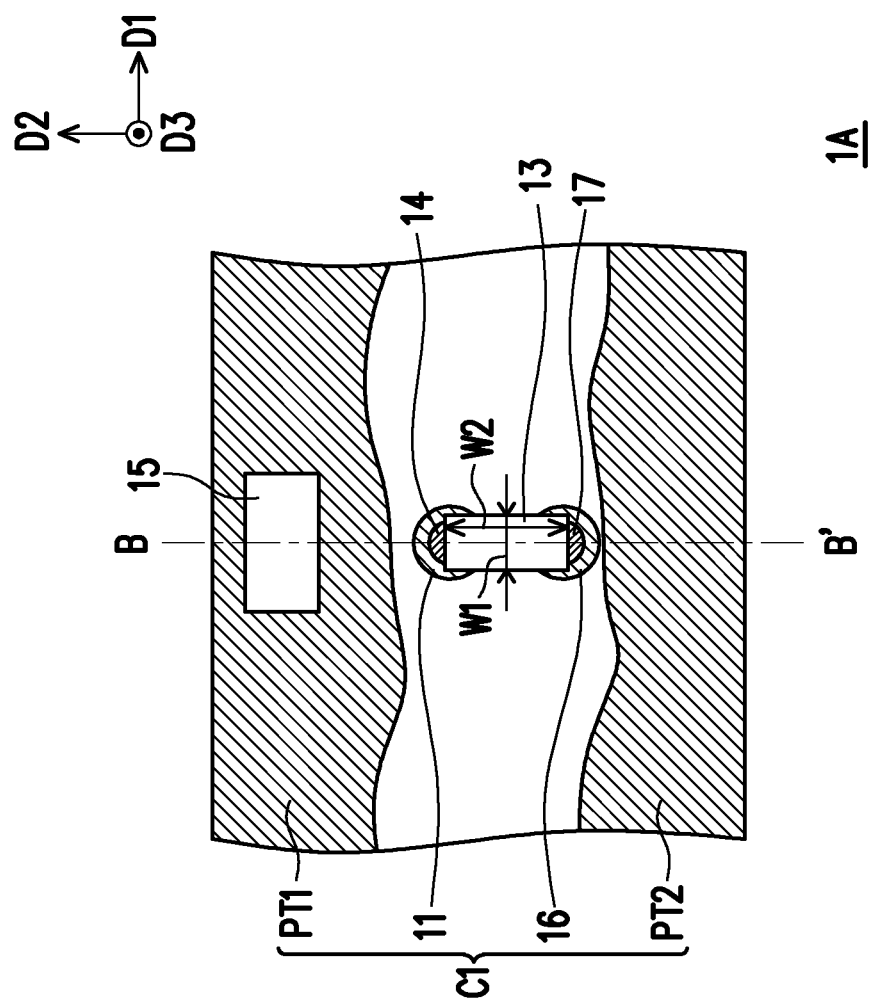

FIG. 2A and FIG. 2B are respectively a schematic partial cross-sectional view and a schematic partial top view of an electronic device according to a second embodiment of the disclosure. In order to clearly show the relative configuration relationships between some elements and/or film layers, FIG. 2B omits illustration of some elements and/or film layers of the electronic device. In addition, reference may be made to FIG. 2A for the cross-section of section line B-B' in FIG. 2B.

With reference to FIG. 2A and FIG. 2B, the main differences between an electronic device 1A and the electronic device 1 of FIG. 1A and FIG. 1B are described as follows. The electronic device 1A includes the substrate 10, the first electrode 11, the second electrode 12, the modulation element 13, the first solder 14, the switch element 15, the third electrode 16, the second solder 17, the fourth electrode 18, a dielectric film 19A, the passivation layer 20, the protection layer 21, a dielectric layer 22, the conductive pattern PT1, the conductive pattern PT2, the connecting pad P3, the connecting pad P4, a connecting pad P5, and a connecting pad P6.

The dielectric film 19A is configured to carry the second conductive layer C2 (including the second electrode 12 and the fourth electrode 18), the switch element 15, and the passivation layer 20. For example, the material of the dielectric film 19A may include, but is not limited to, epoxy resin, acrylic, solder resist, silicon materials, bismaleimide, polyimide, or a combination of the above. In some embodiments, a maximum thickness T19A of the dielectric film 19A in the third direction D3 is greater than or equal to 5 μm and less than or equal to 500 μm. Nonetheless, the disclosure is not limited thereto.

The dielectric film 19A may be attached to the first conductive layer C1 (including the first electrode 11, the third electrode 16, the conductive pattern PT1, and the conductive pattern PT2) through the dielectric layer 22. The material of the dielectric layer 22 may include, for example but not limited to, epoxy resin, acrylic, solder resist, silicon materials, bismaleimide, polyimide, any adhesive material, or a combination of the above. A maximum thickness T22 of the dielectric layer 22 in the third direction D3 may be greater than 1/10000 times the wavelength of the electromagnetic wave and less than 100 times the wavelength of the electromagnetic wave. In some embodiments, the maximum thickness T22 of the dielectric layer 22 in the third direction D3 is greater than or equal to 5 μm and less than or equal to 50 μm. Nonetheless, the disclosure is not limited thereto.

From the cross-sectional view of the electronic device 1A, as shown in FIG. 2A, the dielectric layer 22 is disposed between the first conductive layer C1 and the dielectric film 19A, and the dielectric film 19A is disposed between the second conductive layer C2 and the dielectric layer 22. The passivation layer 20 may have an opening A3 and an opening A4. The opening A3 and the opening A4 respectively expose the second electrode 12 and the fourth electrode 18. The connecting pad P5 and the connecting pad P6 are respectively disposed in an opening A5 and an opening A6. The materials of the connecting pad P5 and the connecting pad P6 may include, but is not limited to, nickel gold, nickel palladium gold, silver, gold, nickel, tin, organic solderability preservative, other conductive materials, or a combination of the above.

The electronic device 1A may have a through hole TH1 and a through hole TH2. The through hole TH1 penetrates the passivation layer 20, the dielectric film 19A, and the dielectric layer 22 and exposes the first electrode 11. The through hole TH2 penetrates the passivation layer 20, the dielectric film 19A, and the dielectric layer 22 and exposes the third electrode 16. The connecting pad P3 is disposed in the through hole TH1 and on the first electrode 11. The connecting pad P4 is disposed in the through hole TH2 and on the third electrode 16.

The first solder 14 is disposed on the connecting pad P5, and the first solder 14 is connected to the connecting pad P3 disposed on the first electrode 11 through the through hole TH1. Specifically, the first solder 14 electrically connects the connecting pad P1, the connecting pad P3, and the connecting pad P5. In some embodiments, the first solder 14 may be in direct contact with the sidewall surface of the second electrode 12, so that the first electrode 11 may be electrically connected to the switch element 15 sequentially through the first solder 14 and the second electrode 12. For example, the first electrode 11 may be electrically connected to the switch element 15 sequentially through the connecting pad P3, the first solder 14, and the second electrode 12. Nonetheless, the disclosure is not limited thereto.

The second solder 17 is disposed on the connecting pad P6, and the second solder 17 is connected to the connecting pad P4 disposed on the third electrode 16 through the through hole TH2. Specifically, the second solder 17 electrically connects the connecting pad P2, the connecting pad P4, and the connecting pad P6. In some embodiments, the second solder 17 may be in direct contact with the sidewall surface of the fourth electrode 18, so that the third electrode 16 may be electrically connected to ground sequentially through the second solder 17 and the fourth electrode 18. For example, the third electrode 16 may be electrically connected to ground sequentially through the connecting pad P4, the second solder 17, and the fourth electrode 18. Nonetheless, the disclosure is not limited thereto.

Respectively disposing the switch element 15 and the first conductive layer C1 on different substrates (e.g., the substrate 10 and the dielectric film 19A) and then attaching the dielectric film 19A to the first conductive layer C1 through the dielectric layer 22 facilitate improving the warpage of the first conductive layer C1 caused by the mismatch between thermal expansion coefficients of the first conductive layer C1 and the substrate 10 during a high-temperature manufacturing process (e.g., the manufacturing of the switch element 15).

Figure 3A:
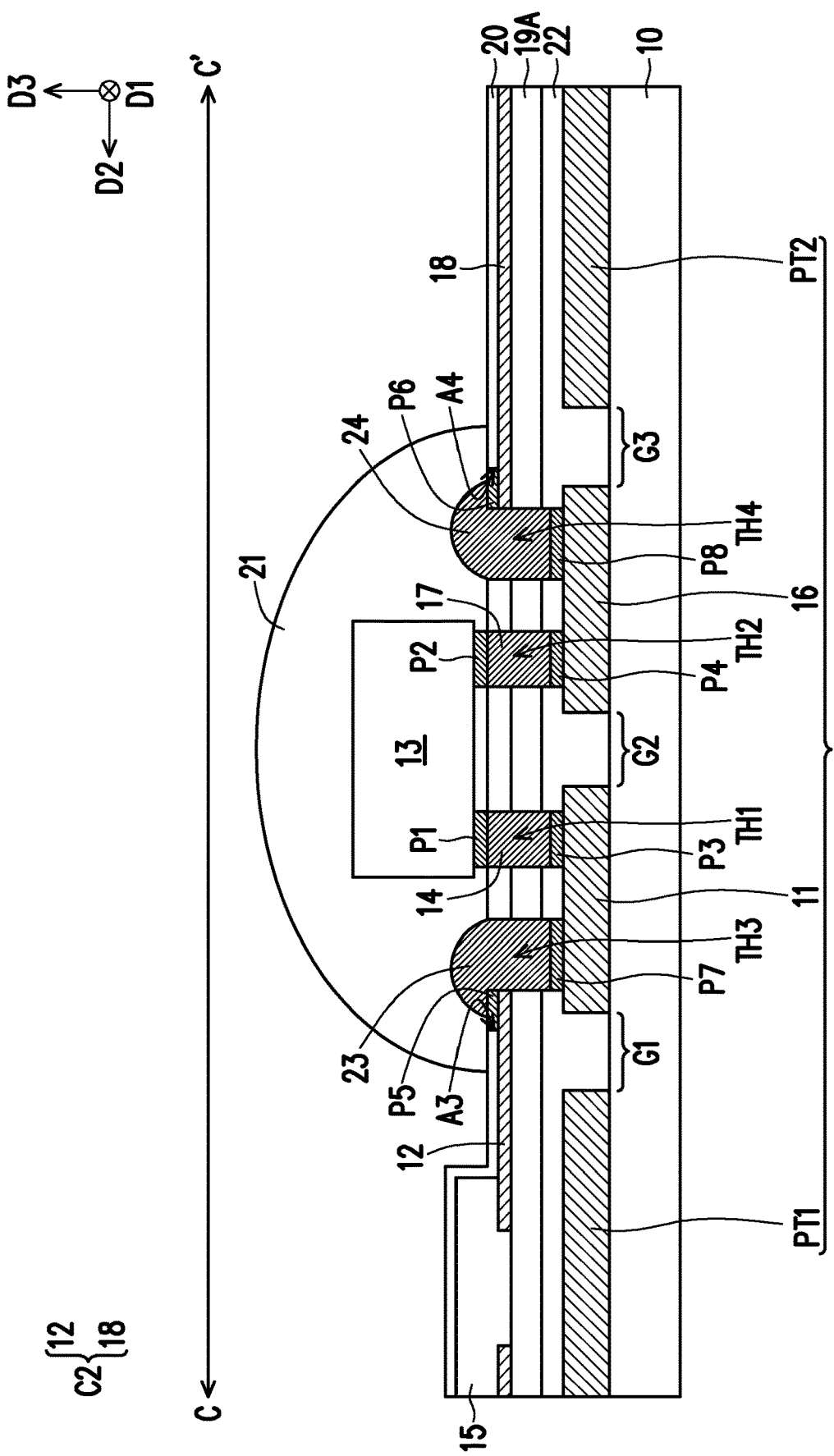
FIG. 3A and FIG. 3B are respectively a schematic partial cross-sectional view and a schematic partial top view of an electronic device according to a third embodiment of the disclosure.
Figure 3B:
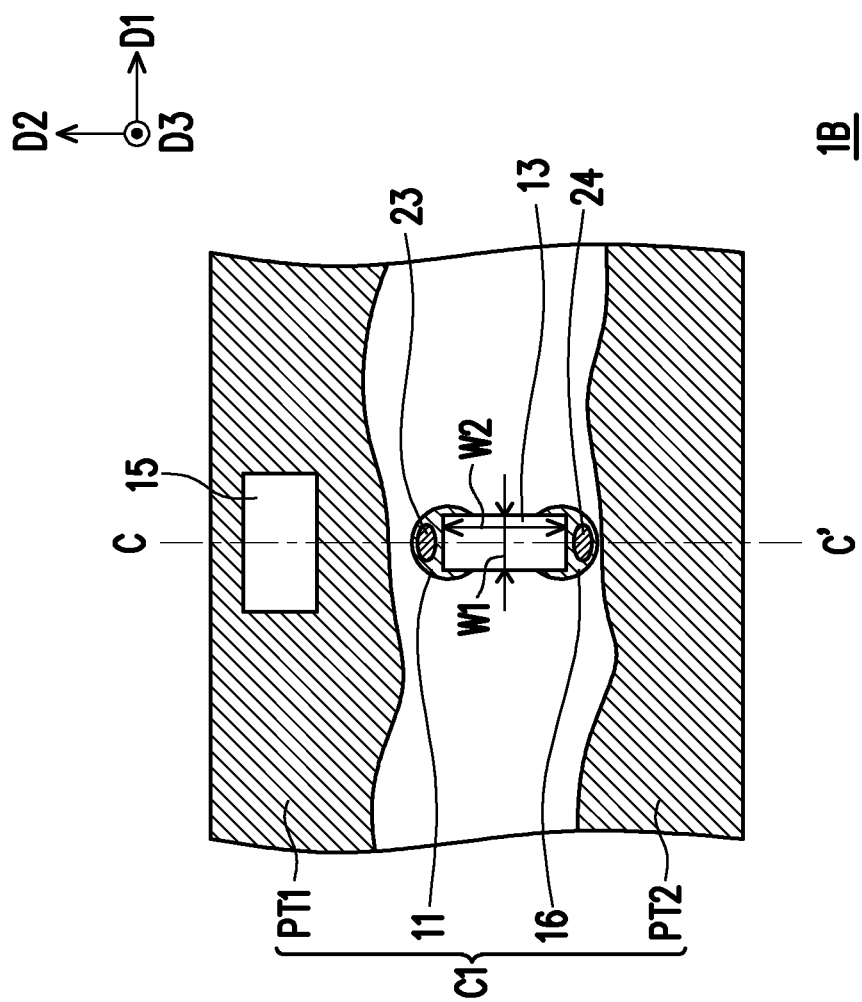

FIG. 3A and FIG. 3B are respectively a schematic partial cross-sectional view and a schematic partial top view of an electronic device according to a third embodiment of the disclosure. In order to clearly show the relative configuration relationships between some elements and/or film layers, FIG. 3B omits illustration of some elements and/or film layers of the electronic device. In addition, reference may be made to FIG. 3A for the cross-section of section line C-C' in FIG. 3B.

With reference to FIG. 3A and FIG. 3B, the main differences between an electronic device 1B and the electronic device 1A of FIG. 2A and FIG. 2B are described as follows. The electronic device 1B includes the substrate 10, the first electrode 11, the second electrode 12, the modulation element 13, the first solder 14, the switch element 15, the third electrode 16, the second solder 17, the fourth electrode 18, the dielectric film 19A, the passivation layer 20, the protection layer 21, the dielectric layer 22, a third solder 23, a fourth solder 24, the conductive pattern PT1, the conductive pattern PT2, the connecting pad P3, the connecting pad P4, the connecting pad P5, the connecting pad P6, a connecting pad P7, and a connecting pad P8.

The electronic device 1B may have a through hole TH3 and a through hole TH4 in addition to the through hole TH1 and the through hole TH2. The through hole TH3 penetrates the passivation layer 20, the dielectric film 19A, and the dielectric layer 22 and exposes the first electrode 11. The through hole TH4 penetrates the passivation layer 20, the dielectric film 19A, and the dielectric layer 22 and exposes the third electrode 16. The through hole TH4, the through hole TH2, the through hole TH1, and the through hole TH3 are arranged in the second direction D2, for example. The through hole TH3 is located between the opening A3 and the through hole TH1, and the through hole TH4 is located between the opening A4 and the through hole TH2.

The connecting pad P7 is disposed in the through hole TH3 and on the first electrode 11. The connecting pad P8 is disposed in the through hole TH4 and on the third electrode 16. The materials of the connecting pad P7 and the connecting pad P8 may include, but is not limited to, nickel gold, nickel palladium gold, silver, gold, nickel, tin, organic solderability preservative, other conductive materials, or a combination of the above.

The first solder 14 electrically connects the connecting pad P1 and the connecting pad P3, and the first solder 14 is separated from the second electrode 12 and the connecting pad P5. The third solder 23 is disposed on the connecting pad P5, and the third solder 23 is connected to the connecting pad P7 disposed on the first electrode 11 through the through hole TH3. In some embodiments, the third solder 23 may be in direct contact with the sidewall surface of the second electrode 12, so that the connecting pad P1 of the modulation element 13 may be electrically connected to the switch element 15 sequentially through the first solder 14 and the second electrode 12. For example, the connecting pad P1 may be electrically connected to the switch element 15 sequentially through the first solder 14, the connecting pad P3, the first electrode 11, the connecting pad P7, the third solder 23, and the second electrode 12.

The second solder 17 electrically connects the connecting pad P2 and the connecting pad P4, and the second solder 17 is separated from the fourth electrode 18 and the connecting pad P6. The fourth solder 24 is disposed on the connecting pad P6, and the fourth solder 24 is connected to the connecting pad P8 disposed on the third electrode 16 through the through hole TH4. In some embodiments, the fourth solder 24 may be in direct contact with the sidewall surface of the fourth electrode 18, so that the connecting pad P2 of the modulation element 13 may be electrically connected to ground sequentially through the second solder 17 and the fourth electrode 18. For example, the connecting pad P2 may be electrically connected to ground sequentially through the second solder 17, the connecting pad P4, the third electrode 16, the connecting pad P8, the fourth solder 24, and the fourth electrode 18.

The third solder 23 and the fourth solder 24 may include, for example but not limited to, solder balls, copper pillars, other suitable metals, or metal alloys. In addition, the protection layer 21 may further cover the third solder 23 and the fourth solder 24.

The design in which each solder is connected between two connecting pads can increase the process yield or facilitate an increase in the productivity capacity.

Figure 4A:
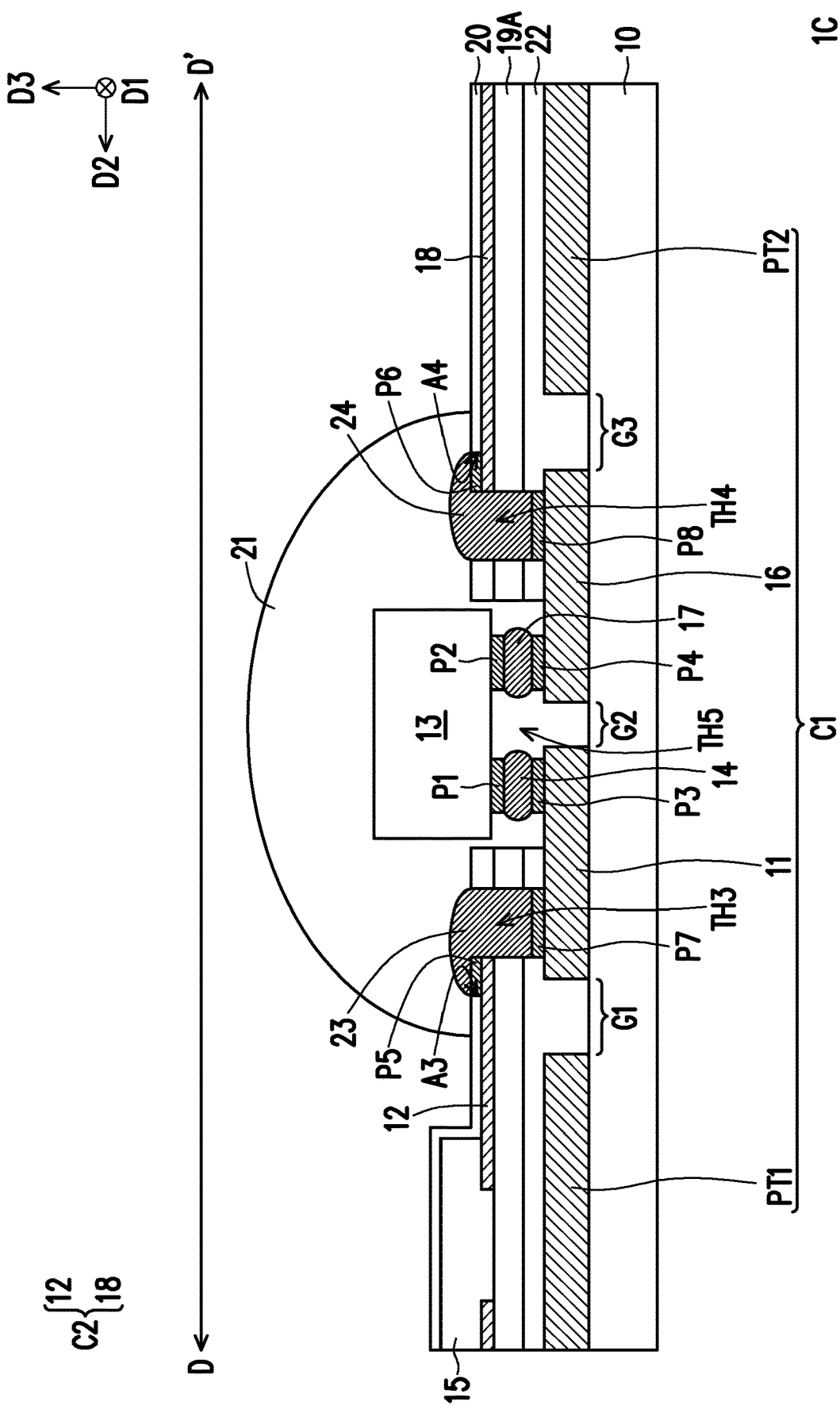
FIG. 4A and FIG. 4B are respectively a schematic partial cross-sectional view and a schematic partial top view of an electronic device according to a fourth embodiment of the disclosure.
Figure 4B:
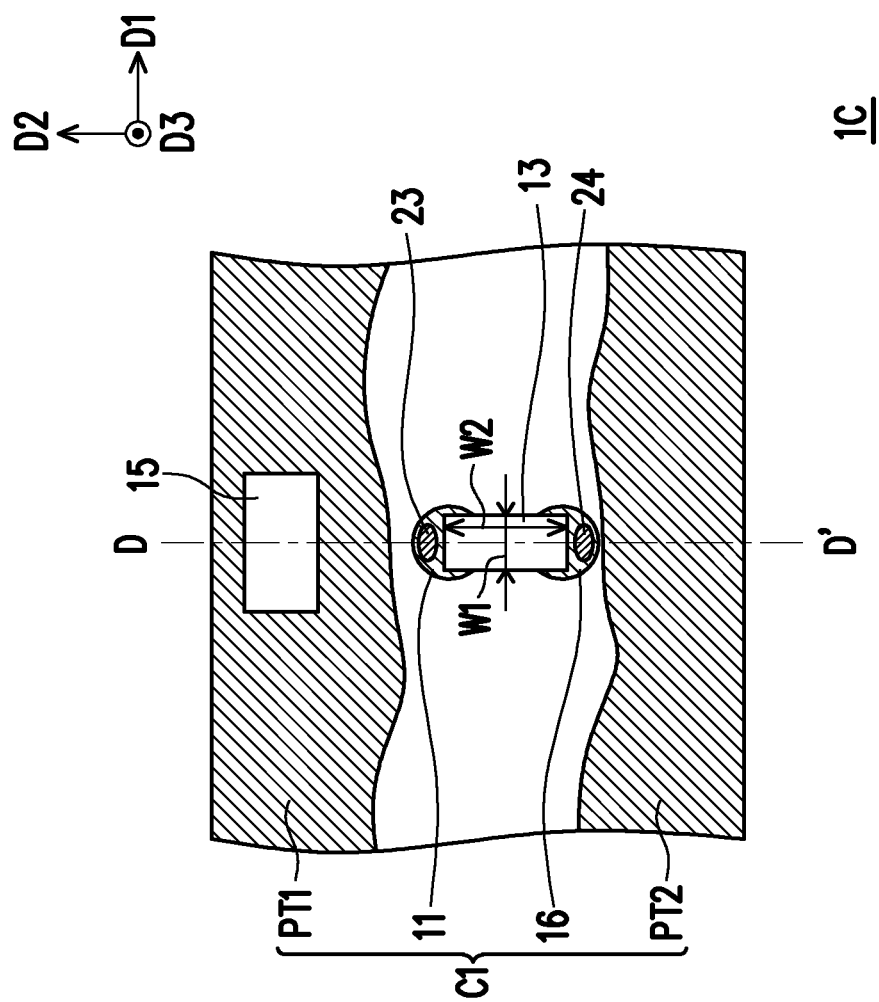

FIG. 4A and FIG. 4B are respectively a schematic partial cross-sectional view and a schematic partial top view of an electronic device according to a fourth embodiment of the disclosure. In order to clearly show the relative configuration relationships between some elements and/or film layers, FIG. 4B omits illustration of some elements and/or film layers of the electronic device. In addition, reference may be made to FIG. 4A for the cross-section of section line D-D' in FIG. 4B.

With reference to FIG. 4A and FIG. 4B, the main differences between an electronic device 1C and the electronic device 1B of FIG. 3A and FIG. 3B are described as follows. In the electronic device 1C, the through hole TH1 and the through hole TH2 in FIG. 3A and FIG. 3B are replaced with a through hole TH5. The through hole TH5 penetrates the passivation layer 20, the dielectric film 19A, and the dielectric layer 22 and exposes the first electrode 11, the third electrode 16, and the substrate 10 exposed by the first electrode 11 and the third electrode 16. The modulation element 13 is disposed in the through hole TH5. The connecting pad P1 of the modulation element 13 is bonded to the connecting pad P3 disposed on the first electrode 11 through the first solder 14, and the connecting pad P2 of the modulation element 13 is bonded to the connecting pad P4 disposed on the third electrode 16 through the second solder 17.

By forming a through hole (e.g., the through hole TH5) with a relatively large pore size, the modulation element 13 can be conveniently disposed or the adjustable range of the modulation element 13 can be increased.

Figure 5B:
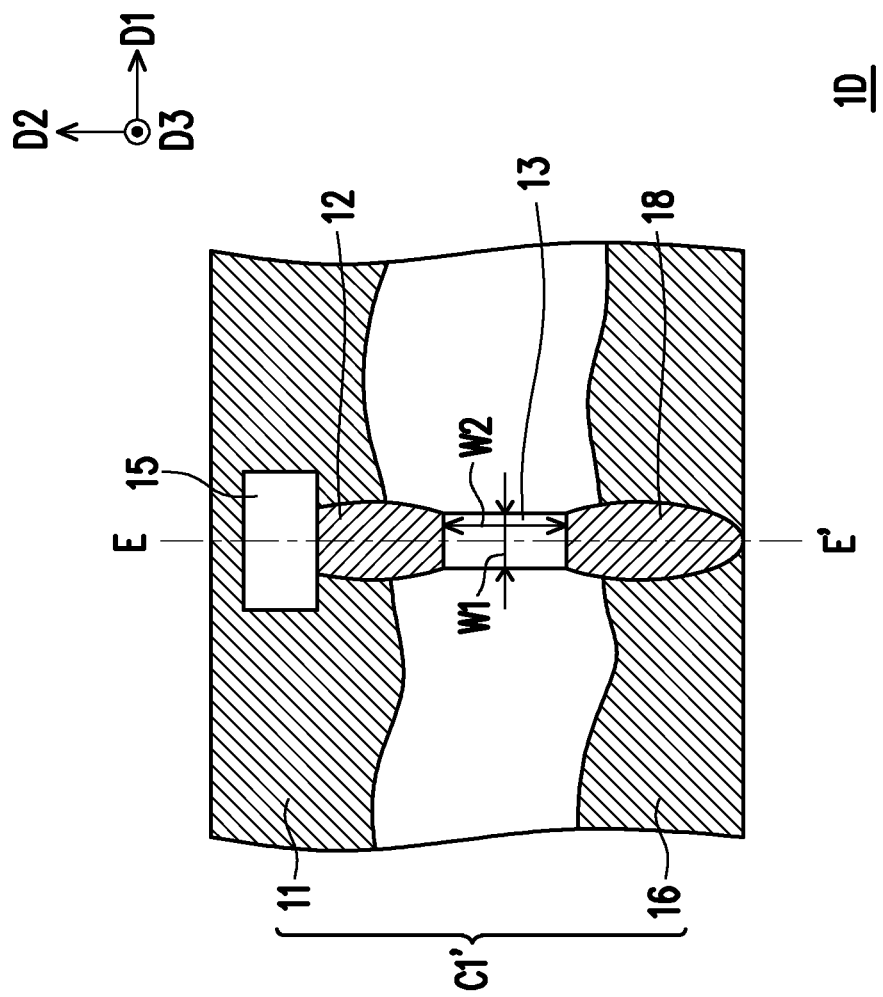

FIG. 5A and FIG. 5B are respectively a schematic partial cross-sectional view and a schematic partial top view of an electronic device according to a fifth embodiment of the disclosure. In order to clearly show the relative configuration relationships between some elements and/or film layers, FIG. 5B omits illustration of some elements and/or film layers of the electronic device. In addition, reference may be made to FIG. 5A for the cross-section of section line E-E' in FIG. 5B.

With reference to FIG. 5A and FIG. 5B, the main differences between an electronic device 1D and the electronic device 1A of FIG. 2A and FIG. 2B are described as follows. In the electronic device 1D, it is possible that a first conductive layer C1' does not include the conductive pattern PT1 and the conductive pattern PT2. In addition, it is possible that the electronic device 1D does not include the through hole TH1, the through hole TH2, the connecting pad P3, and the connecting pad P4. Moreover, the modulation element 13 is electrically coupled to the first electrode 11, and one connecting pad (e.g., the connecting pad P1) of the modulation element 13 is electrically connected to the switch element 15.

To be specific, the first solder 14 is, for example, electrically connected to the connecting pad P1 and the connecting pad P5. In addition, the connecting pad P1 of the modulation element 13 is electrically connected to the switch element 15 sequentially through the first solder 14, the connecting pad P5, and the second electrode 12, for example. On the other hand, the modulation element 13 is also electrically coupled to the third electrode 16. For example, the third electrode 16 is electrically coupled to the connecting pad P2 of the modulation element 13. The second solder 17 is, for example, electrically connected to the connecting pad P2 and the connecting pad P6. In addition, the connecting pad P2 of the modulation element 13 is, for example, electrically connected to ground sequentially through the second solder 17, the connecting pad P6, and the fourth electrode 18.

In some embodiments, the first conductive layer C1' and a second conductive layer C2' may each be a metal layer. The electromagnetic wave transmitted below the first conductive layer C1' may be transmitted to the modulation element 13 sequentially through the gap G2 of the first conductive layer C1' and a gap G4 of the second conductive layer C2'. The electromagnetic wave may be output from the electronic device 1D after operation (e.g., adjustment of the phase, amplitude, transmission direction, or the like of the electromagnetic wave) of the modulation element 13. The size of the gap G2 may be smaller than, equal to, or larger than the gap G4, which is not particularly limited herein.

The design in which the first conductive layer C1' and the second conductive layer C2' are overlapped in the third direction D3 facilitates an increase in the adjustable capacitance.

Figure 6A:
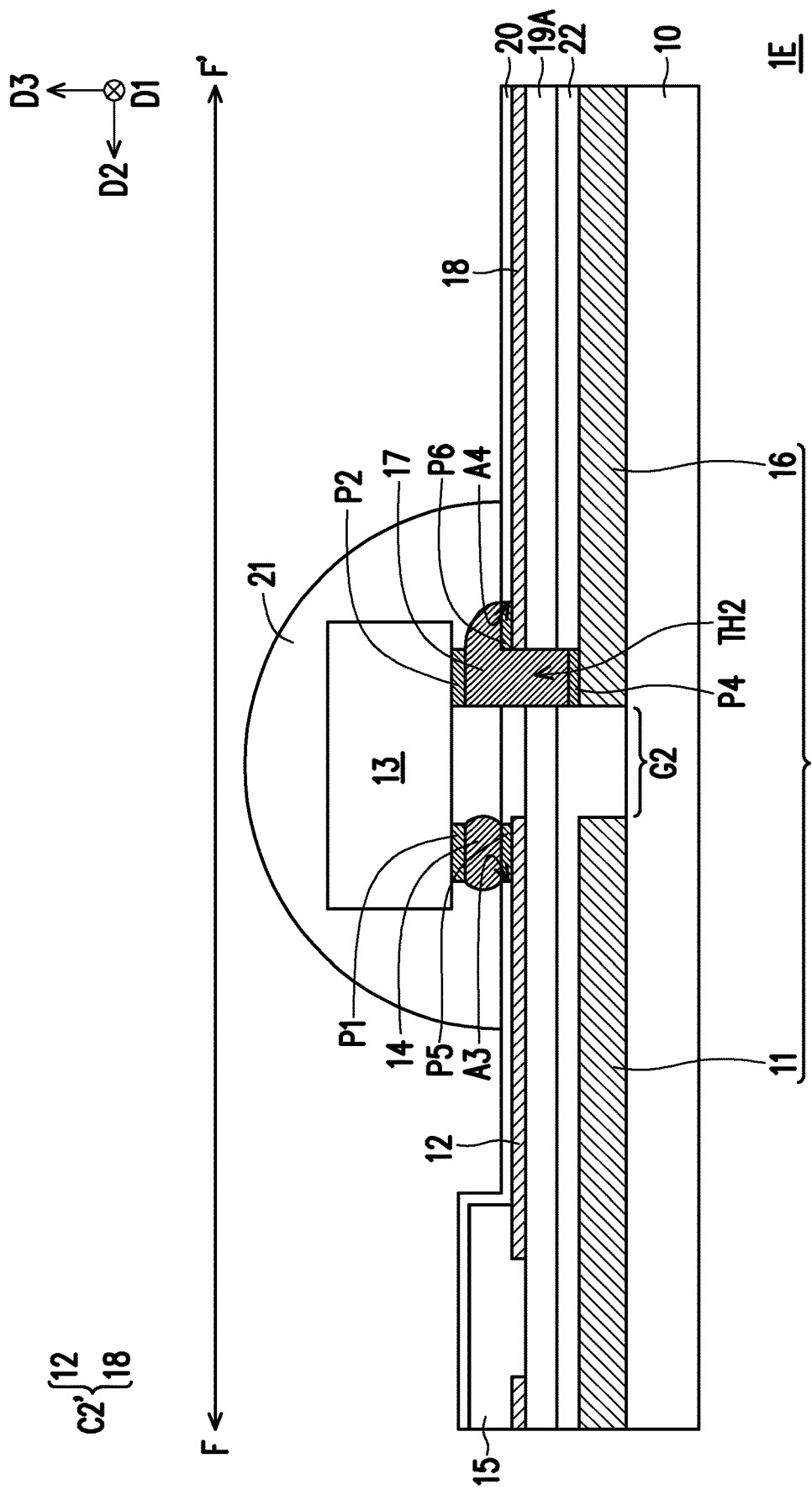
FIG. 6A and FIG. 6B are respectively a schematic partial cross-sectional view and a schematic partial top view of an electronic device according to a sixth embodiment of the disclosure.
Figure 6B:
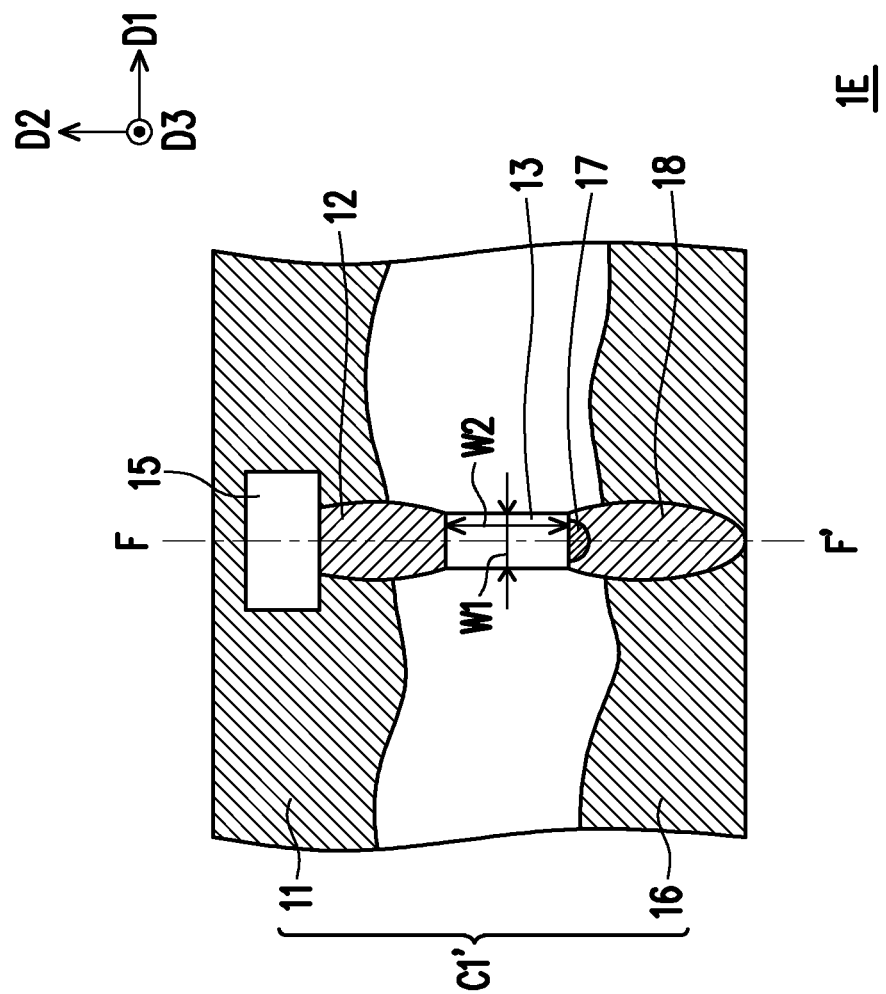

FIG. 6A and FIG. 6B are respectively a schematic partial cross-sectional view and a schematic partial top view of an electronic device according to a sixth embodiment of the disclosure. In order to clearly show the relative configuration relationships between some elements and/or film layers, FIG. 6B omits illustration of some elements and/or film layers of the electronic device. In addition, reference may be made to FIG. 6A for the cross-section of section line F-F' in FIG. 6B.

With reference to FIG. 6A and FIG. 6B, the main differences between an electronic device 1E and the electronic device 1D of FIG. 5A and FIG. 5B are described as follows. The electronic device 1E includes the through hole TH2 and the connecting pad P4. In addition, the third electrode 16 is electrically connected to the connecting pad P2 of the modulation element 13.

For example, the second solder 17 may be disposed on the connecting pad P6 and electrically connected between the connecting pad P2 and the connecting pad P4 through the through hole TH2.

In some other embodiments, although not shown, the first solder 14 may be disposed on the connecting pad P5 and electrically connected between the connecting pad P1 and the connecting pad P3 through the through hole TH1 (see FIG. 2A). In addition, the second solder 17 may be electrically connected between the connecting pad P2 and the connecting pad P6 (see FIG. 5A).

In this embodiment, the third electrode 16 may be electrically connected to ground. Nonetheless, the disclosure is not limited thereto. In some other embodiments, the third electrode 16 may receive a first DC voltage, and the fourth electrode 18 may receive a second DC voltage. Nonetheless, the disclosure is not limited thereto. In some other embodiments, the manufacturing of the third electrode 16 may be omitted.

Figure 7:
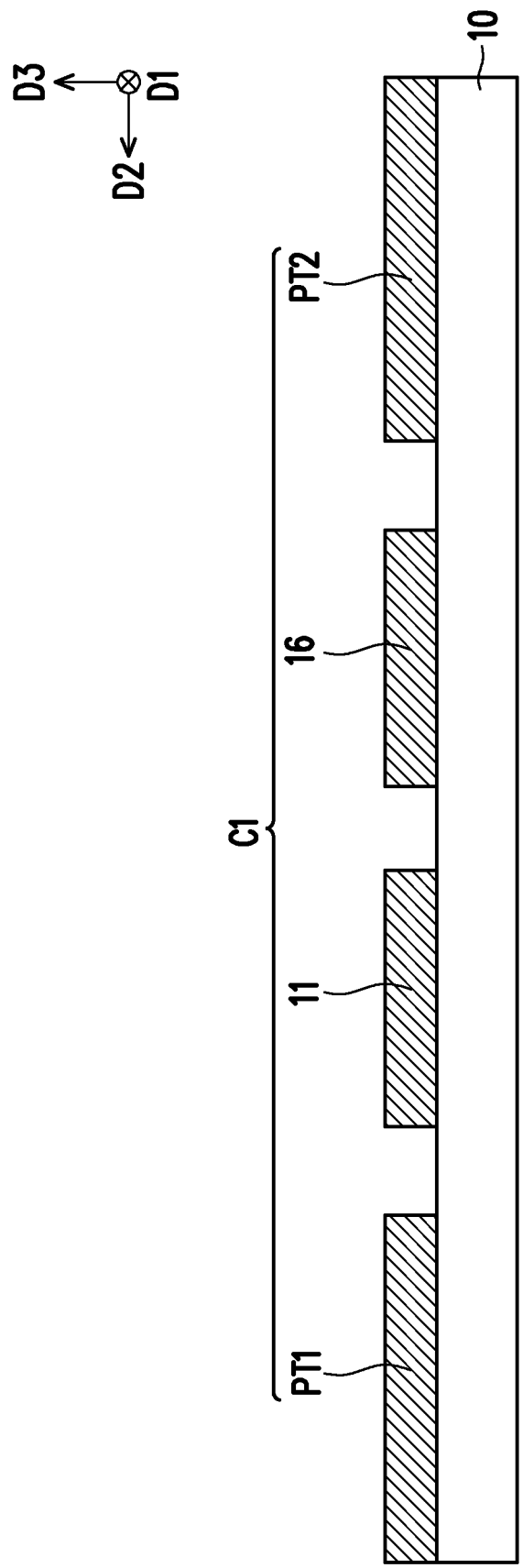
FIG. 7 to FIG. 9 are schematic partial cross-sectional views of manufacturing process flows of the electronic device according to the first embodiment of the disclosure.
Figure 8:
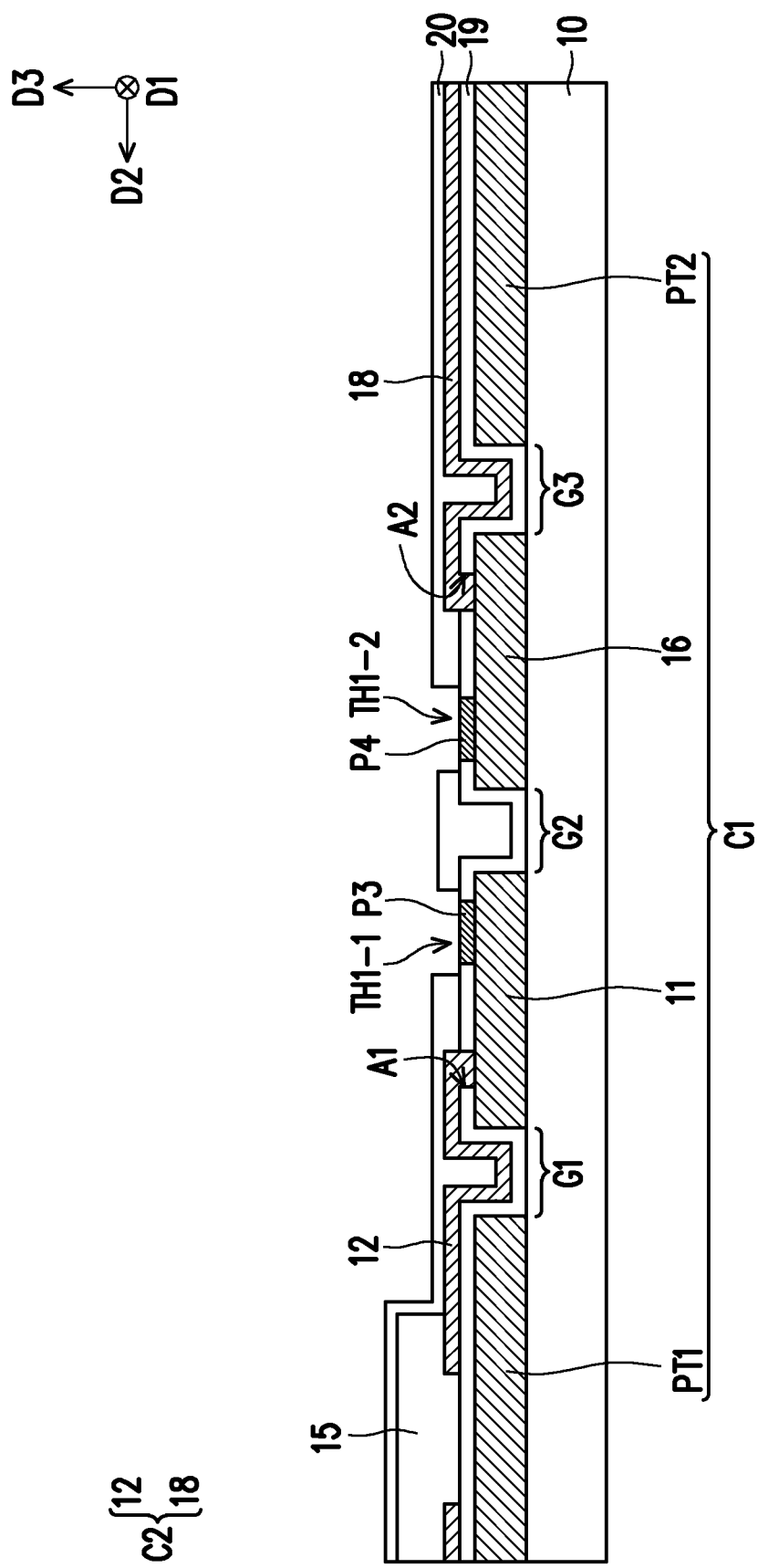
Figure 9:
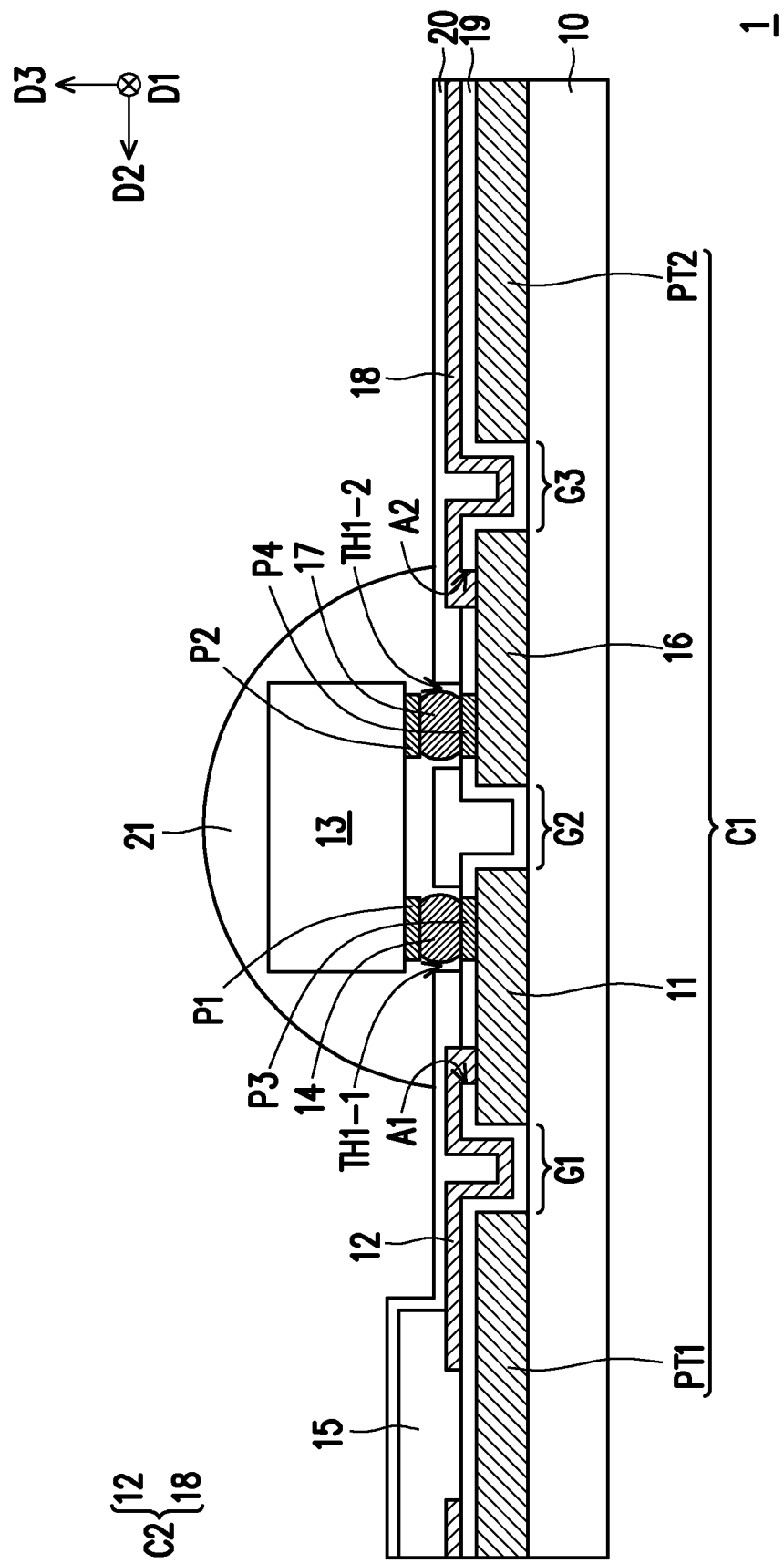

FIG. 7 to FIG. 9 are schematic partial cross-sectional views of manufacturing process flows of the electronic device according to the first embodiment of the disclosure. With reference to FIG. 7 first, the first conductive layer C1 is formed on the substrate 10. The first conductive layer C1 is a patterned conductive layer and may include the first electrode 11, the third electrode 16, the conductive pattern PT1, and the conductive pattern PT2. Nonetheless, the disclosure is not limited thereto.

With reference to FIG. 8, after the first conductive layer C1 is formed, the isolation layer 19, the second conductive layer C2, the switch element 15, and the passivation layer 20 are sequentially formed on the substrate 10. The second conductive layer C2 is a patterned conductive layer and may include the second electrode 12 and the fourth electrode 18. Nonetheless, the disclosure is not limited thereto.

In some embodiments, the switch element 15 may be directly formed on the substrate 10 through a photolithography process to facilitate the manufacturing. In some other embodiments, the switch element 15 may be bonded onto the substrate 10 through conductive bumps (not shown) to reduce the manufacturing cost.

Next, the through hole TH1-1 and the through hole TH1-2 penetrating the passivation layer 20 and the isolation layer 19 are formed. The through hole TH1-1 and the through hole TH1-2 may be formed by, for example but not limited to, photolithography and etching.

Then, the connecting pad P3 and the connecting pad P4 are formed in the through hole TH1-1 and the through hole TH1-2, respectively. The connecting pad P3 and the connecting pad P4 may be formed by, for example but not limited to, chemical plating, immersion, electrolysis, or the like.

With reference to FIG. 9, the first solder 14 and the second solder 17 are respectively formed on the connecting pad P3 and the connecting pad P4 by printing. Next, the connecting pad P1 and the connecting pad P2 of the modulation element 13 are respectively disposed on the first solder 14 and the second solder 17. Then, the connecting pad P1 and the connecting pad P2 of the modulation element 13 are fixed on the first solder 14 and the second solder 17 through solder reflow. Next, the protection layer 21 is formed. As such, the manufacturing of the electronic device 1 is preliminarily completed.

Figure 10:
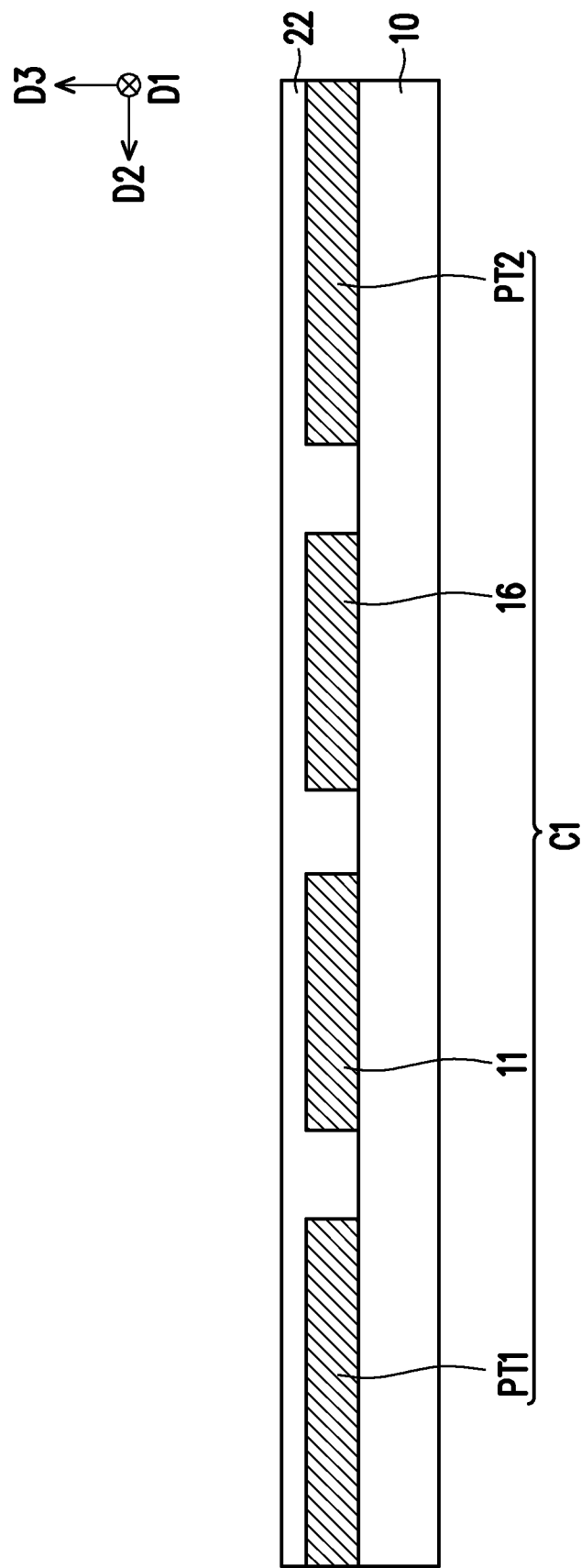
FIG. 10 to FIG. 13 are schematic partial cross-sectional views of manufacturing process flows of the electronic device according to the second embodiment of the disclosure.

FIG. 10 to FIG. 13 are schematic partial cross-sectional views of manufacturing process flows of the electronic device according to the second embodiment of the disclosure. With reference to FIG. 10 first, the first conductive layer C1 and the dielectric layer 22 are sequentially formed on the substrate 10.

Figure 11:
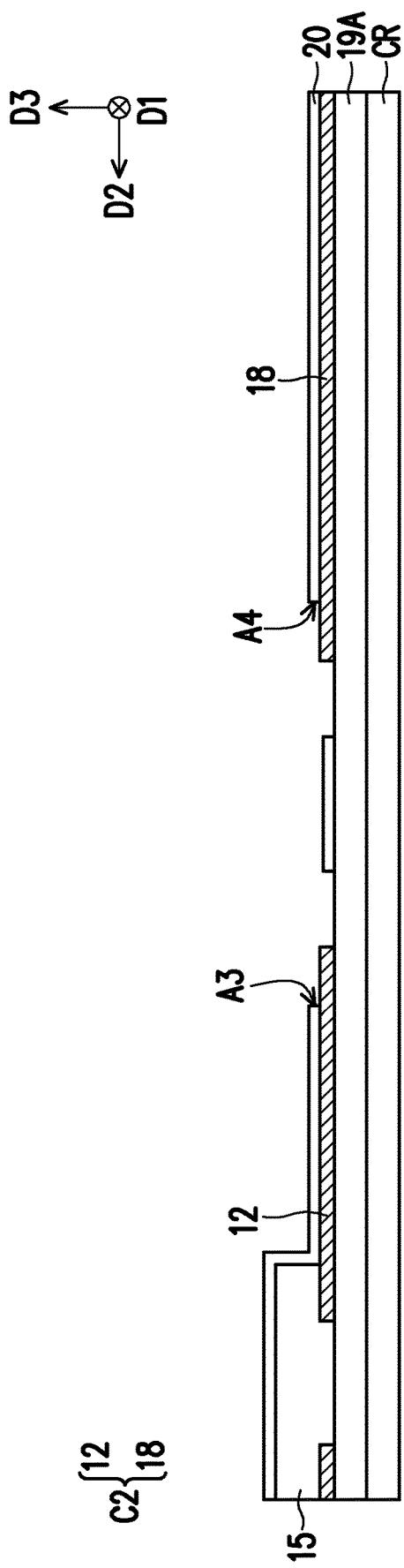

With reference to FIG. 11, the dielectric film 19A, the second conductive layer C2 (including the second electrode 12 and the fourth electrode 18), and the passivation layer 20 are sequentially formed on a carrier CR. The carrier board CR may include a rigid carrier board, such as a glass substrate. Nonetheless, the disclosure is not limited thereto.

In some embodiments, the steps shown in FIG. 11 may be performed after the steps shown in FIG. 10. In some other embodiments, the steps shown in FIG. 10 may be performed after the steps shown in FIG. 11.

Figure 12:
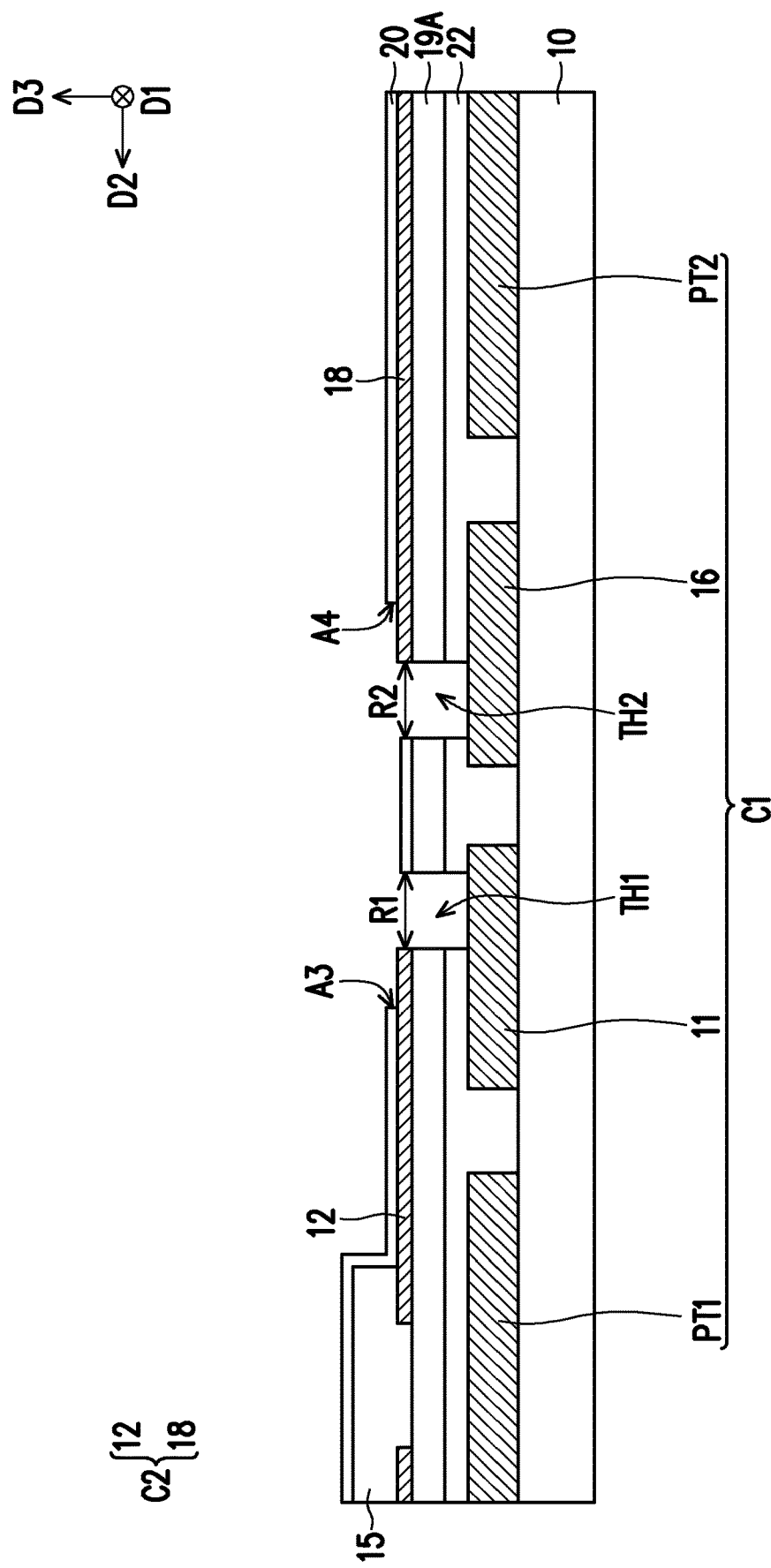

With reference to FIG. 12, the carrier board CR is removed, and the dielectric film 19A is attached to the dielectric layer 22. The carrier CR may be removed, for example, by laser lift-off, namely by irradiating a release layer (not shown) disposed between the carrier CR and the dielectric film 19A with laser to separate the carrier CR and the dielectric film 19A. Nonetheless, the disclosure is not limited thereto.

Next, the through hole TH1 and the through hole TH2 penetrating the passivation layer 20, the dielectric film 19A, and the dielectric layer 22 are formed to expose the first electrode 11 and the third electrode 16. The through hole TH1 and the through hole TH2 may be formed by, for example but not limited to, laser drilling. In other embodiments, at least one of the through hole TH1 and the through hole TH2 may also be formed by photolithography and etching, laser drilling, or a combination of the above. A pore size R1 (e.g., a diameter) of the through hole TH1 and a pore size R2 (e.g., a diameter) of the through hole TH2 may be greater than or equal to 40 μm to facilitate subsequent formation of solders in the through hole TH1 and the through hole TH2. Nonetheless, the disclosure is not limited thereto.

Figure 13:
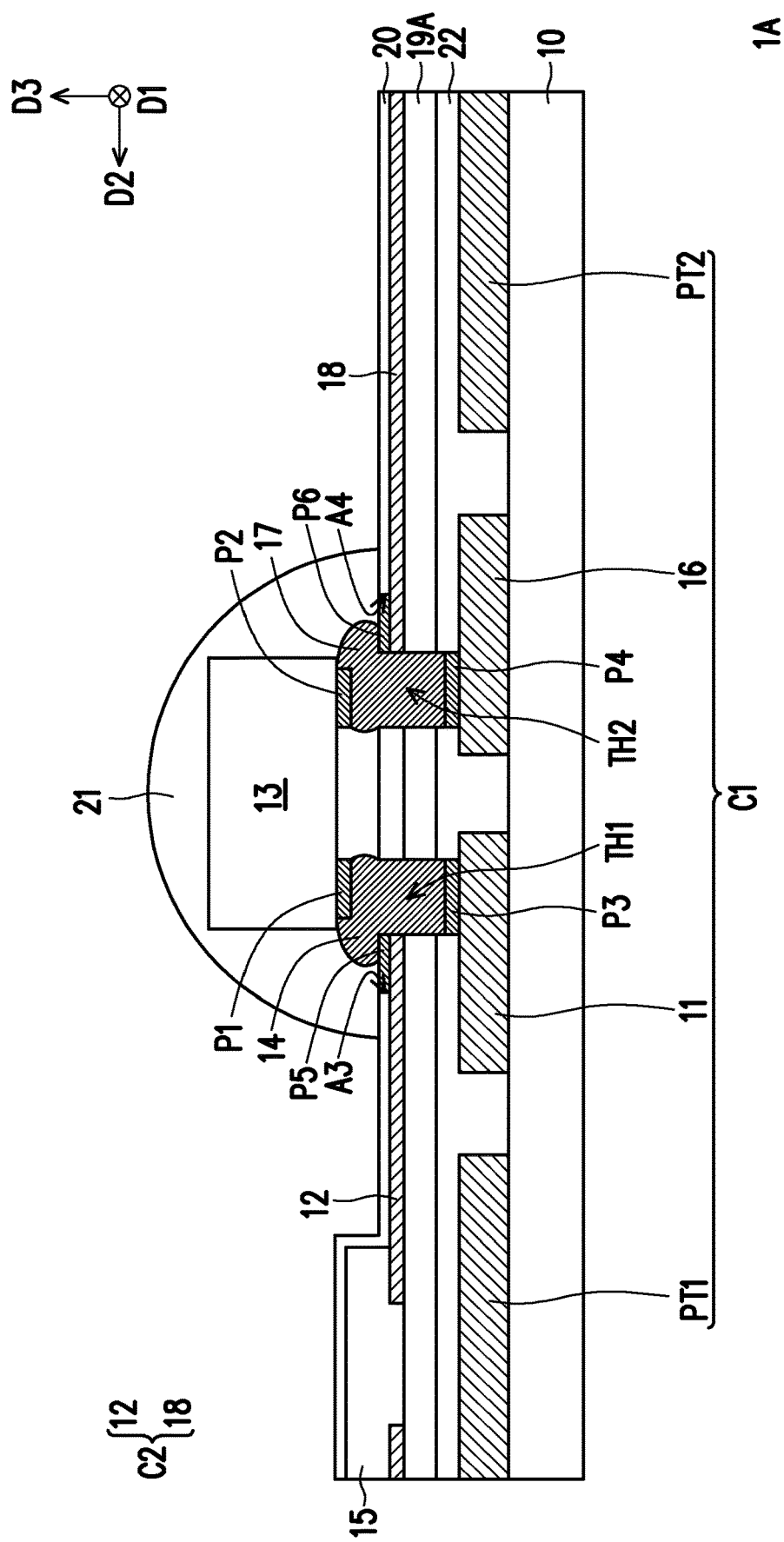

With reference to FIG. 13, the connecting pad P5, the connecting pad P3, the connecting pad P4, and the connecting pad P6 are respectively formed in the opening A3, the through hole TH1, the through hole TH2, and the opening A4. The connecting pad P5, the connecting pad P3, the connecting pad P4, and the connecting pad P6 may be formed by, for example but not limited to, chemical plating, immersion, electrolysis, or the like.

Next, the first solder 14 is formed on the connecting pad P3 and the connecting pad P5 and the second solder 17 is formed on the connecting pad P4 and the connecting pad P6 by printing or the like. Then, the connecting pad P1 and the connecting pad P2 of the modulation element 13 are respectively disposed on the first solder 14 and the second solder 17. Next, the connecting pad P1 and the connecting pad P2 of the modulation element 13 are fixed on the first solder 14 and the second solder 17 through solder reflow. Then, the protection layer 21 is formed. As such, the manufacturing of the electronic device 1A is preliminarily completed.

The manufacturing methods of the electronic device 1B to the electronic device 1E are generally similar to the manufacturing method of the electronic device 1A, and will thus not be described in detail below.

In addition, although not shown, the electronic device 1A to the electronic device 1E may also be modified according to FIG. 1A, where the conductive layers, the switch element, the modulation element, the solders, the isolation layer, the passivation layer, the connecting pads, and the protection layer are disposed on the same substrate (e.g., the substrate 10).

In addition, in the above-mentioned embodiments, although the switch element and other elements/film layers are all disposed on the same side of the substrate, the disclosure is not limited thereto. In other embodiments not shown, the switch element may also be disposed below the substrate, so that the switch element and other elements/film layers are respectively disposed on opposite sides of the substrate. Under this architecture, the switch element may be electrically connected to the second electrode through circuits (e.g., vias or other circuits) not shown.

Figure 14:
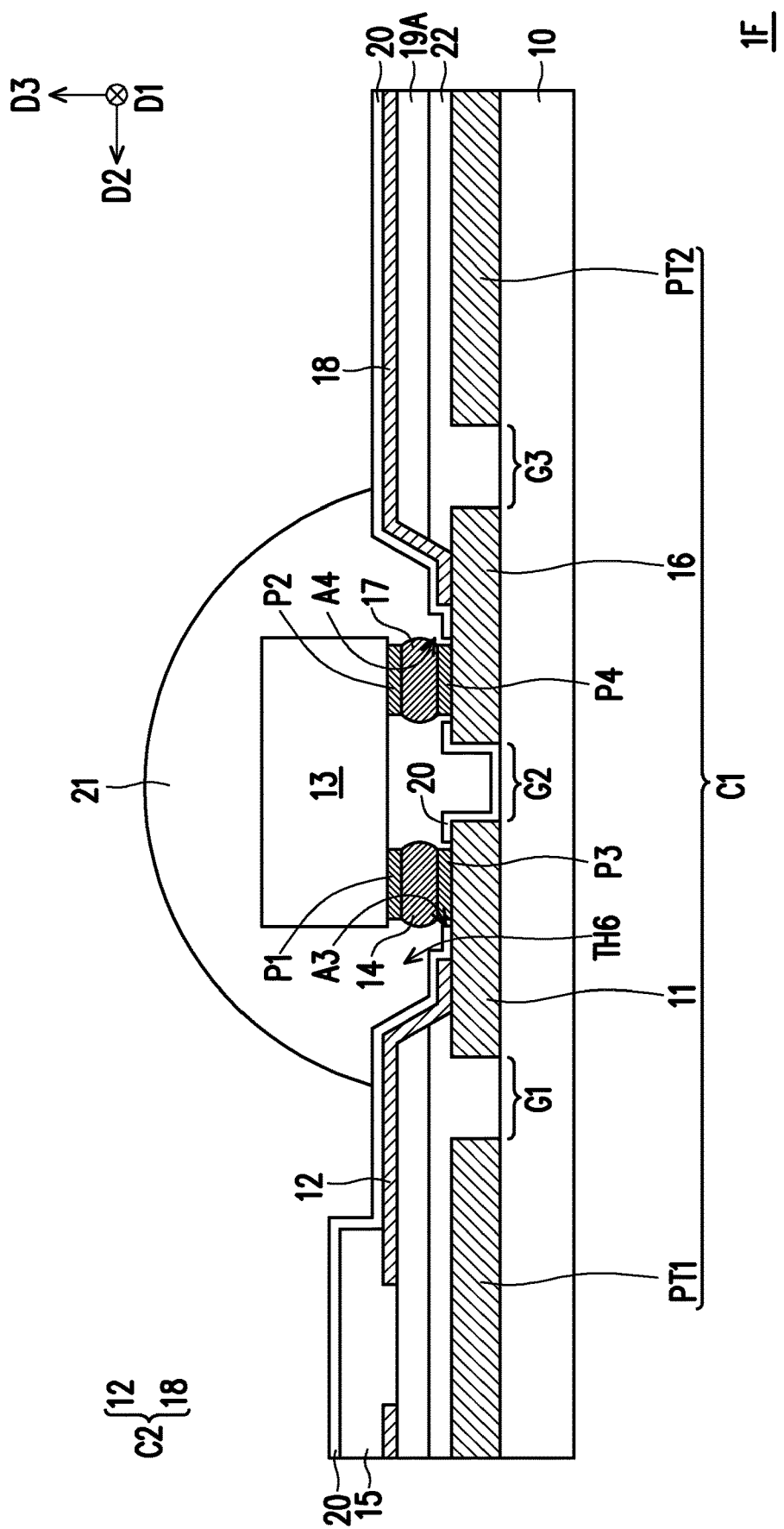
FIG. 14 and FIG. 15 are respectively schematic partial cross-sectional views of an electronic device according to a seventh embodiment and an eighth embodiment of the disclosure.
Figure 15:
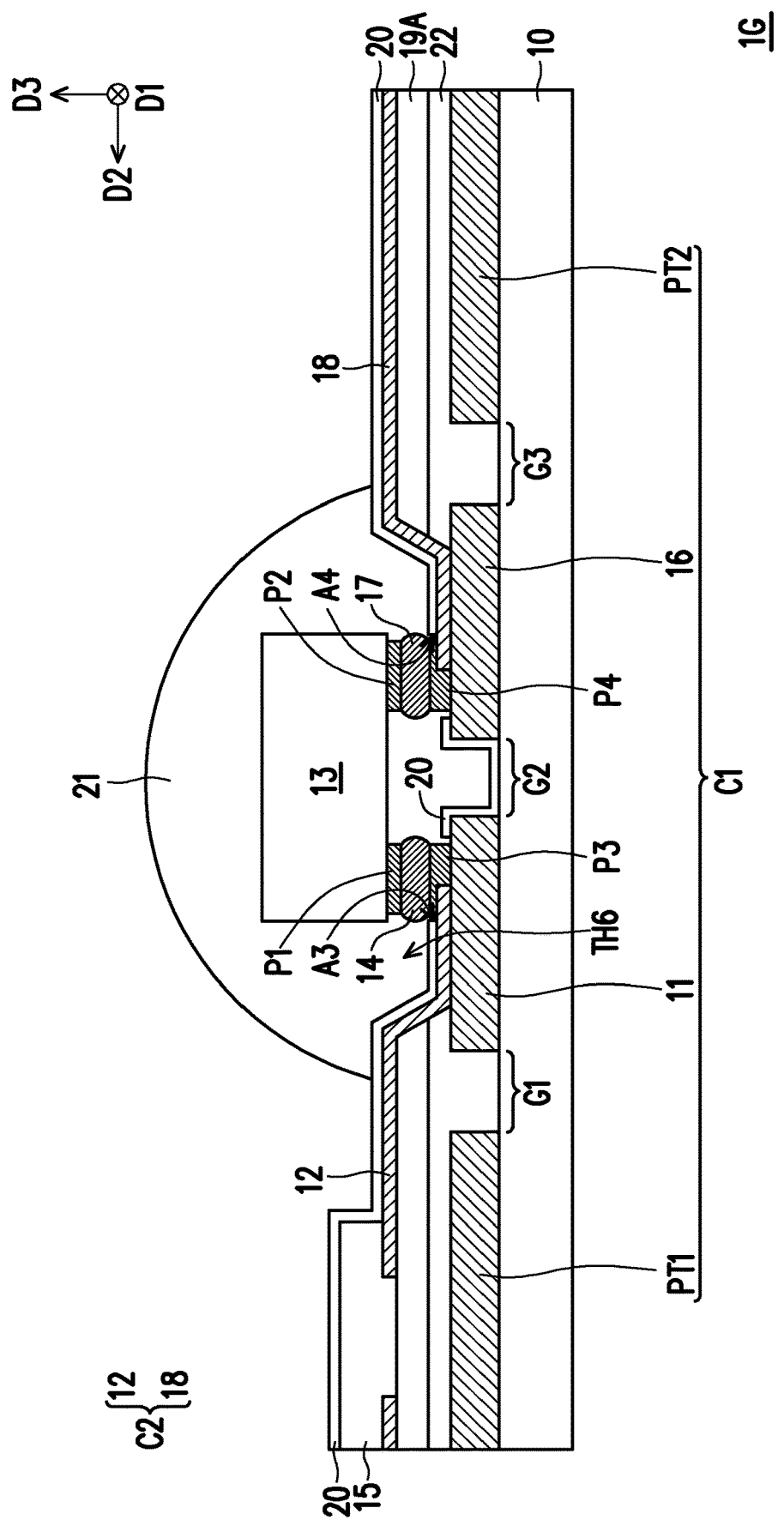

FIG. 14 and FIG. 15 are respectively schematic partial cross-sectional views of an electronic device according to a seventh embodiment and an eighth embodiment of the disclosure. For the schematic partial top view of the electronic devices of FIG. 14 and FIG. 15, reference may be made to FIG. 1B.

With reference to FIG. 14, the main differences between an electronic device 1F and the electronic device 1A of FIG. 2A are described as follows. In the electronic device 1F, after the dielectric film 19A is disposed on the substrate 10, a through hole TH6 that penetrates the dielectric film 19A and the dielectric layer 22 and exposes the first electrode 11 and the third electrode 16 is formed. Next, the second conductive layer C2 is formed on the substrate 10. The second electrode 12 of the second conductive layer C2 is disposed on the dielectric film 19A, extends into the through hole TH6, and is in contact with the first electrode 11. The fourth electrode 18 of the second conductive layer C2 is disposed on the dielectric film 19A, extends into the through hole TH6, and is in contact with the third electrode 16. Then, the switch element 15 and the passivation layer 20 are formed. Next, the connecting pad P3 and the connecting pad P4 are respectively formed in the opening A3 and the opening A4 of the passivation layer 20. Moreover, the connecting pad P1 and the connecting pad P2 of the modulation element 13 are fixed on the connecting pad P3 and the connecting pad P4 through the first solder 14 and the second solder 17. Then, the protection layer 21 is formed. As such, the manufacturing of the electronic device 1F is preliminarily completed.

During the manufacturing of the electronic device 1F, the dielectric film 19A and the dielectric layer 22 at the gap G2 are removed when the through hole TH6 is formed. Accordingly, in the electronic device 1F, the dielectric film 19A and the dielectric layer 22 are not present below the modulation element 13. In addition, the second electrode 12 is in contact with the first electrode 11, and the second electrode 12 is separated from the connecting pad P3 by the passivation layer 20; the fourth electrode 18 is in contact with the third electrode 16, and the fourth electrode 18 is separated from the connecting pad P4 by the passivation layer 20.

With reference to FIG. 15, the main differences between an electronic device 1G and the electronic device 1F of FIG. 14 are described as follows. In the electronic device 1G, the opening A3 exposes part of the second electrode 12, and the connecting pad P3 is disposed on the first electrode 11 and covers the part of the second electrode 12 exposed by the opening A3. In addition, the opening A4 exposes part of the fourth electrode 18, and the connecting pad P4 is disposed on the third electrode 16 and covers the part of the fourth electrode 18 exposed by the opening A4.

Figure 16A:
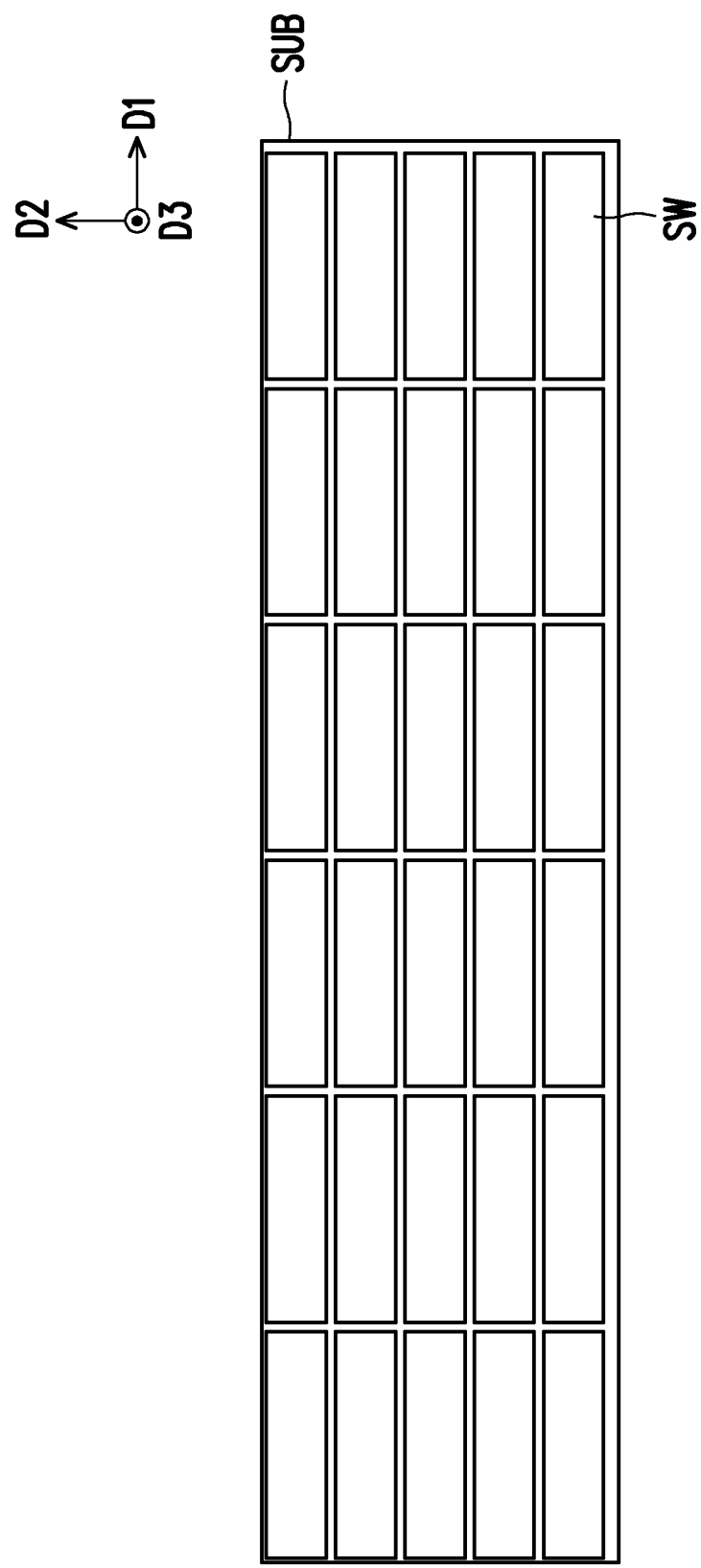
FIG. 16A to FIG. 16D are schematic partial views of manufacturing process flows of an electronic device according to a ninth embodiment of the disclosure.
Figure 16B:
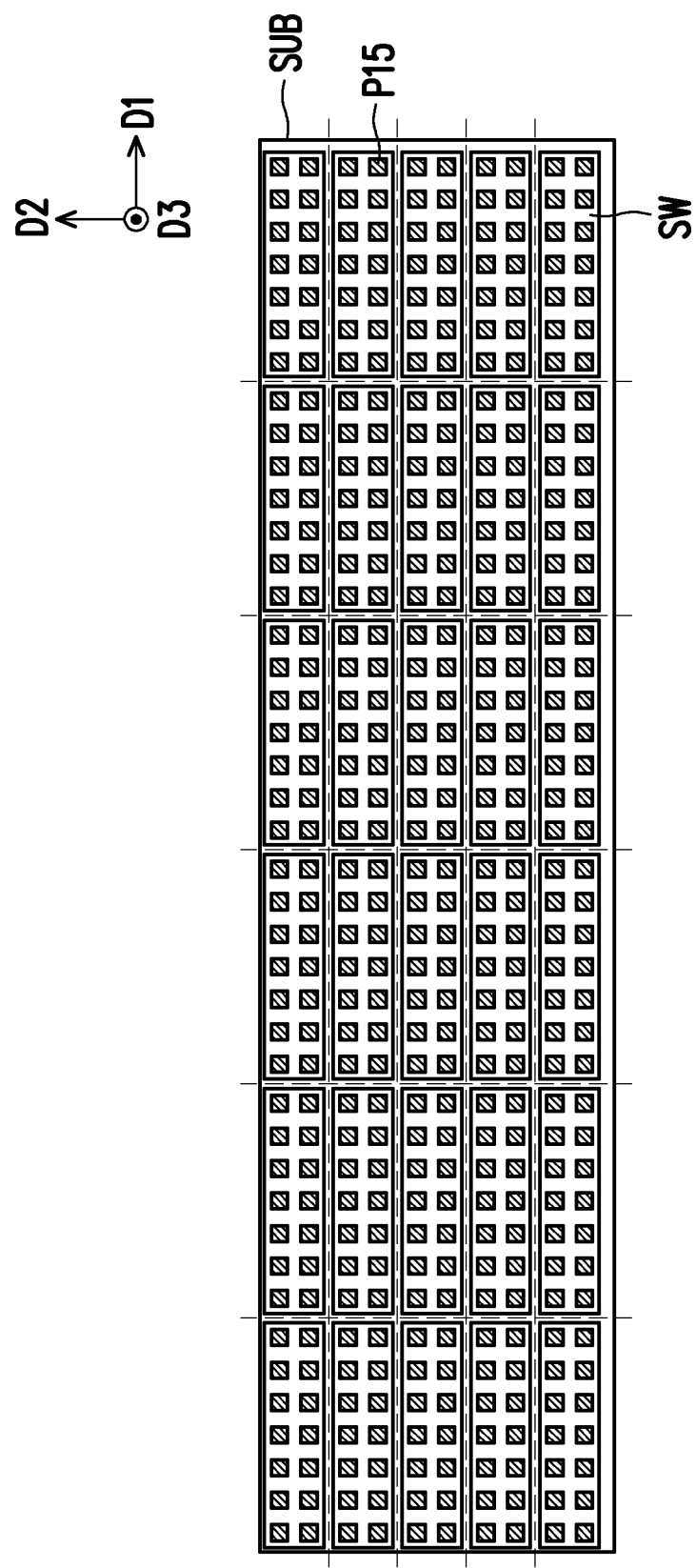
Figure 16C:
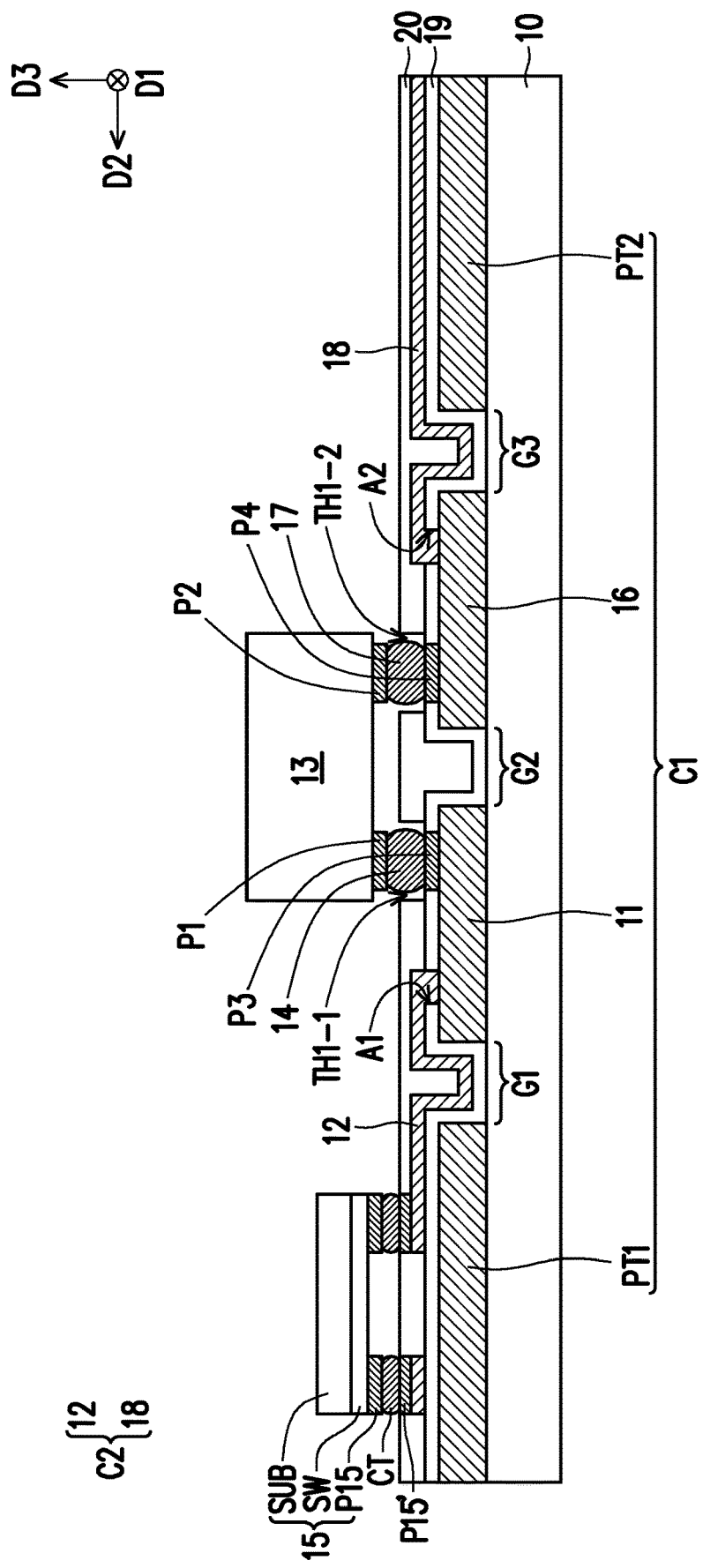
Figure 16D:
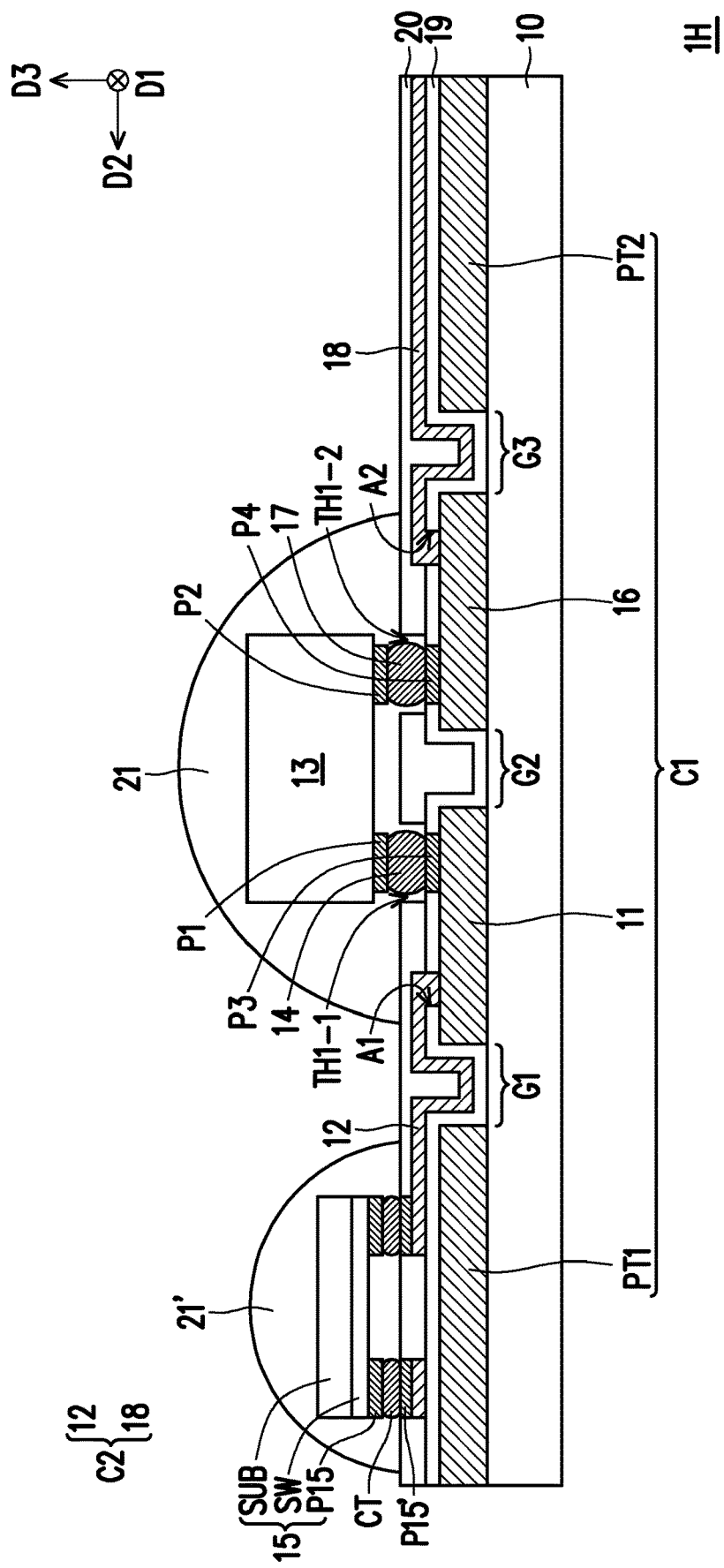

FIG. 16A to FIG. 16D are schematic partial views of manufacturing process flows of an electronic device according to a ninth embodiment of the disclosure, wherein FIGS. 16A and 16B are schematic partial top views, and FIGS. 16C and 16D are schematic partial cross-sectional views.

With reference to FIG. 16A, a plurality of switches SW are formed on a substrate SUB. For example, the substrate SUB may include, but is not limited to, a glass substrate, a polymer film, a printed circuit board, a base layer formed of ceramics, or a combination of the above. The switches SW may include thin film transistors (TFTs). The material of the channel layer (not shown) of the thin film transistor may include, but is not limited to, low-temperature polysilicon, amorphous silicon, oxide semiconductor, organic semiconductor, III-V compound semiconductor, or the like. The plurality of switches SW may be arranged along the first direction D1 and the second direction D2.

With reference to FIG. 16B, a plurality of bonding pads P15 are formed on the plurality of switches SW. The materials of the connecting pads P15' may include, but is not limited to, nickel gold, nickel palladium gold, silver, gold, nickel, tin, organic solderability preservative (OSP), other conductive materials, or a combination of the above. Then, a cutting process is performed on the substrate SUB to form a plurality of switch elements 15 (one switch element 15 is shown in FIG. 16C and FIG. 16D) separated from each other. For example, a laser (not shown) is utilized to cut the substrate SUB along cutting lines (see dash lines in FIG. 16B).

With reference to FIG. 16C, the switch element 15 and the modulation element 13 are then bonded to the substrate 10 through solders CT. For example, the bonding pads P15 of the switch element 15 are bonded to connecting pads P15' on the substrate 10 through solders CT. The solders CT may include, for example but not limited to, a tin ball, a copper pillar, any other suitable metals, or a metal alloy. The materials of the bonding pads P15 may include, but is not limited to, nickel gold, nickel palladium gold, silver, gold, nickel, tin, organic solderability preservative (OSP), other conductive materials, or a combination of the above. Please refer to the previous description for the method of bonding the modulation element 13 to the substrate 10, which will not be repeated here.

With reference to FIG. 16D, an electronic device 1H is formed after a protection layer 21 and a protection layer 21' are formed on the passivation layer 20. The protection layer 21 may cover the modulation element 13 and wrap the connecting pad P1, the connecting pad P2, the first solder 14, and the second solder 17. The protection layer 21' may cover the switch element 15 and wrap the connecting pads P15' and the solders CT. In some embodiments, the material of the protection layer 21' may include, but is not limited to, epoxy resin, acrylic, solder resist, silicon materials, bismaleimide, polyimide, parylene, or a combination of the above. Materials of the protection layer 21' and the protection layer 21 may be the same or different. For example, dielectric constant (Dk) and dissipation factor (Df) of the protection layer 21 may be lower than those of the protection layer 21', respectively. In some embodiments, the dissipation factor of the protection layer 21 may be less than 0.01, but is not limited thereto.

In summary of the foregoing, in the embodiments of the disclosure, by changing the voltage applied to the variable capacitor, the equivalent capacitance in the radio frequency circuit can be controlled, so that the phase and the amplitude of the electromagnetic wave change correspondingly, thus controlling the direction of the electromagnetic wave or improving directivity of the radio frequency device.

Each of the above embodiments only serves for describing, instead of limiting, the technical solutions of the disclosure. Although the disclosure has been described in detail with reference to the above-mentioned embodiments, those ordinarily skilled in the art should understand that the technical solutions described in the above-mentioned embodiments may still be combined or modified, or that some or all technical features therein may be equivalently replaced. However, the nature of the corresponding technical solutions so combined, modified, or replaced does not depart from the scope of the technical solutions of the embodiments of the disclosure.

Although the embodiments and the advantages thereof have been disclosed as above, it should be understood that any person having ordinary skill in the art may make variations, replacements, and modifications without departing from the spirit and scope of the disclosure, and the feature in each embodiment may be arbitrarily mixed with and replaced by each other to form another new embodiment. In addition, the protection scope of the disclosure is not limited to a process, machine, manufacturing, material composition, device, method, and step in a specific embodiment in this specification. Any person having ordinary skill in the art can understand from the content of the disclosure that the existing or to-be-developed process, machine, manufacturing, material composition, device, method, and step may be used according to the disclosure as long as the substantially same function can be implemented or the substantially same result can be obtained in the embodiments described herein. Therefore, the protection scope of the disclosure includes the above-mentioned process, machine, manufacturing, material composition, device, method, and step. In addition, each claim forms an independent embodiment, and the protection scope of the disclosure also includes a combination of each of the claims and embodiments. The protection scope of the disclosure should be subject to the appended claims.

What is claimed is:

1. An electronic device, comprising:
   a substrate;
   a first electrode disposed on the substrate;
   a second electrode disposed on the substrate;
   a modulation element disposed on the substrate and comprising at least two connecting pads;
   a first solder disposed between the first electrode and one of the at least two connecting pads of the modulation element;
   a protection layer covering the modulation element and wrapping the at least two connecting pads of the modulation element and the first solder, wherein a part of the protective layer is disposed between the modulation element and the substrate; and
   a switch element disposed on the substrate,
   wherein the one of the at least two connecting pads of the modulation element is electrically connected to the switch element sequentially through the first solder, the first electrode, and the second electrode,
   wherein in a thickness direction of the electronic device, the first electrode is disposed between the substrate and the second electrode, and the second electrode is disposed between the first electrode and the switch element.

2. The electronic device according to claim 1, further comprising:
   a third electrode disposed on the substrate; and
   a second solder disposed between the third electrode and another one of the connecting pads of the modulation element, wherein the another one of the connecting pads of the modulation element is electrically connected to the third electrode through the second solder.

3. The electronic device according to claim 2, wherein the third electrode and the first electrode are manufactured in the same layer.

4. The electronic device according to claim 2, wherein the third electrode and the first electrode are separated from each other.

5. The electronic device according to claim 1, further comprising:
   a third electrode disposed on the substrate, wherein another one of the connecting pads of the modulation element is electrically connected to the third electrode.

6. The electronic device according to claim 5, wherein the third electrode and the first electrode are manufactured in the same layer.

7. The electronic device according to claim 5, wherein the third electrode and the first electrode are separated from each other.

\* \* \* \* \*